US011842762B2

(12) United States Patent
Ware et al.

(10) Patent No.: US 11,842,762 B2
(45) Date of Patent: Dec. 12, 2023

(54) SYSTEM APPLICATION OF DRAM COMPONENT WITH CACHE MODE

(71) Applicant: RAMBUS INC., San Jose, CA (US)

(72) Inventors: Frederick Ware, Los Altos Hills, CA (US); Thomas Vogelsang, Mountain View, CA (US); Michael Raymond Miller, Raleigh, NC (US); Collins Williams, Raleigh, NC (US)

(73) Assignee: Rambus Inc., San Jose, CA (US)

( * ) Notice: Subject to any disclaimer, the term of this patent is extended or adjusted under 35 U.S.C. 154(b) by 43 days.

(21) Appl. No.: 17/439,215

(22) PCT Filed: Mar. 16, 2020

(86) PCT No.: PCT/US2020/022907
§ 371 (c)(1),
(2) Date: Sep. 14, 2021

(87) PCT Pub. No.: WO2020/190841
PCT Pub. Date: Sep. 24, 2020

(65) Prior Publication Data
US 2022/0165326 A1      May 26, 2022

Related U.S. Application Data

(60) Provisional application No. 62/820,144, filed on Mar. 18, 2019.

(51) Int. Cl.
*G11C 11/4093*     (2006.01)
*G06F 12/0895*     (2016.01)
(Continued)

(52) U.S. Cl.
CPC ...... *G11C 11/4093* (2013.01); *G06F 12/0895* (2013.01); *G11C 8/18* (2013.01); *G11C 11/4076* (2013.01); *G11C 11/4087* (2013.01); *G11C 2207/2245* (2013.01)

(58) Field of Classification Search
CPC ... G11C 11/4093; G11C 8/18; G11C 11/4076; G11C 11/4087
(Continued)

(56) References Cited

U.S. PATENT DOCUMENTS 5,577,223 A     11/1996   Tanoi et al.
5,617,347 A      4/1997   Lauritzen
(Continued)

FOREIGN PATENT DOCUMENTS

WO     WO-99-05604     2/1999

OTHER PUBLICATIONS

Charles A. Hart, "CDRAM in a Unified Memory Architecture", Mitsubishi Electronics America 1063-6390194 1994 IEEE. 6 Pages.
(Continued)

*Primary Examiner* — Anthan Tran
(74) *Attorney, Agent, or Firm* — Womble Bond Dickinson (US) LLP

(57) ABSTRACT

Disclosed is a memory system that has a memory controller and may have a memory component. The memory component may be a dynamic random access memory (DRAM). The memory controller is connectable to the memory component. The memory component has at least one data row and at least one tag row different from and associated with the at least one data row. The memory system is to implement a cache having multiple ways to hold a data group. The memory controller is operable in each of a plurality of operating modes. The operating modes include a first operating mode and a second operating mode. The first operating mode and the second operating mode have differing addressing and timing for accessing the data group. The memory controller has cache read logic that sends a cache read command, cache results logic that receives a response from the memory component, and cache fetch logic.

7 Claims, 37 Drawing Sheets

(51) Int. Cl.
  *G11C 8/18* (2006.01)
  *G11C 11/4076* (2006.01)
  *G11C 11/408* (2006.01)

(58) Field of Classification Search
  USPC .................................................... 365/189.05
  See application file for complete search history.

(56) References Cited

U.S. PATENT DOCUMENTS

| | | | |
|---|---|---|---|
| 5,657,469 | A | 8/1997 | Shimizu |
| 5,777,942 | A | 7/1998 | Dosaka et al. |
| 6,848,035 | B2 | 1/2005 | Akiyama et al. |
| 8,874,849 | B2 | 10/2014 | Solihin |
| 9,753,858 | B2 | 9/2017 | Loh et al. |
| 9,779,025 | B2 | 10/2017 | Walker |
| 2003/0135694 | A1* | 7/2003 | Naffziger ............ G06F 12/0802 711/E12.017 |
| 2004/0117600 | A1* | 6/2004 | Bodas .................. H04L 69/161 712/210 |
| 2013/0138892 | A1 | 5/2013 | Loh et al. |
| 2013/0318307 | A1 | 11/2013 | Rabinovitch et al. |
| 2018/0267911 | A1 | 9/2018 | Ware et al. |

OTHER PUBLICATIONS

Gabriel H. Loh et. al. "G. H. Loh and M. D. Hill, Efficiently enabling conventional block sizes for very large die-stacked DRAM caches," 2011 44th Annual IEEE/ACM International Symposium on Microarchitecture (MICRO), Porto Alegre, 2011, pp. 454-464. 11 pages.

Grant Ayers et. al "Memory Hierarchy for Web Search" 2018 IEEE International Symposium on High Performance Computer Architecture (HPCA), Vienna, 2018, pp. 643-656. doi: 10.1109/HPCA. 2018.00061. 14 pages.

Moinuddin K. Qureshi and Gabriel H. Loh "Fundamental Latency Trade-offs in Architecting DRAM Caches", Dept. of Electrical and Computer Engineering Georgia Institute of Technology and AMD Research Advanced Micro Devices, Inc., 45th Annual IEEE, 2012. 12 Pages.

Notification of Transmittal of the International Search Report and the Written Opinion of the International Searching Authority, or the Declaration dated Jul. 28, 2020 re: Int'l Appln. No. PCT/US2020/ 022907. 13 pages.

Paul Tschirhart et al, "The Case for Associative DRAM Caches", MEMSYS Oct. 3-6, 2016, 2016, Washington, DC, USA DOI: http://dx.doi.org/10.1145/2989081.2989120. 9 pages.

* cited by examiner

SYSTEM APPLICATION OF DRAM COMPONENT WITH CACHE MODE

REFERENCE TO RELATED APPLICATION

This application is a US National Stage 371 of PCT International Application No.: PCT/US2020/022907, filed 16 Mar. 2020, which claims the benefit of, U.S. Provisional Patent Application No. 62/820,144 filed 18 Mar. 2019, titled "SYSTEM APPLICATION OF DRAM COMPONENT WITH CACHE MODE", the entire contents of which are hereby incorporated by reference herein.

BACKGROUND

Dynamic Random Access Memory (DRAM) is in use in a wide variety of computers and computing devices as system memory. Now that DRAM scaling is slowing down, storage class memory (SCM) with lowered costs and DRAM will be useful to continue growing memory system capacity. Hybrid memory systems combining SCM with DRAM cache may be useful due to the longer latency and limited endurance of SCM compared to DRAM.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
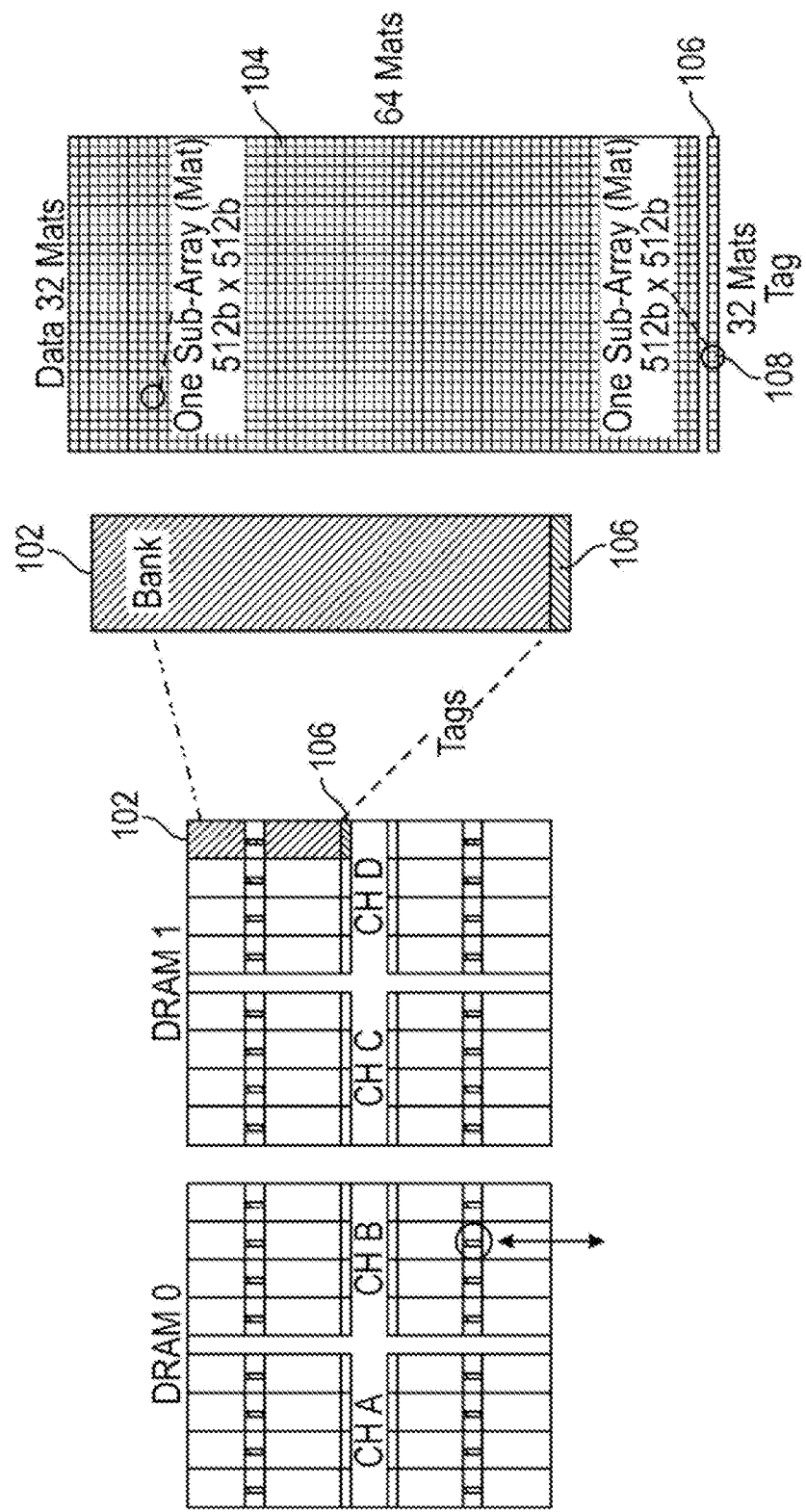
FIG. 1A illustrates an embodiment of a DRAM with data rows and tag rows, which can be operated as a multiway set associative cache, or multiway, set associative cache.

In the following description, various aspects of the illustrative embodiments will be described using terms commonly employed by those skilled in the art to convey the substance of their work to others skilled in the art. For purposes of explanation, specific numbers, materials and configurations are set forth in order to provide a thorough understanding of the illustrative embodiments. However, it will be apparent to one skilled in the art that the present disclosure may be practiced with only some of the described aspects or without the specific details. In other instances, well-known features are omitted or simplified in order not to obscure the illustrative embodiments.

DRAM architecture and controller modifications described herein enable tag storage and comparison on the DRAM, and access to cached data. In some versions, the DRAM is operable as a multiway set associative cache, and also operable as a standard DRAM, e.g., if not part of a hybrid system with storage class memory or other memory. Sets of data from storage class memory or other memory can be cached in ways in the DRAM cache and accessed when a tag comparison indicates a cache hit.

In typical systems, circuitry outside of the DRAM die performs the tag matching. Using standard DRAM parts as cache in a hybrid memory system includes transferring tag information bits from the DRAM to the chip doing the tag matching prior to being able to access the data information on the DRAM. This creates both a latency overhead and a power overhead compared to modifying the DRAM to enable tag matching on the DRAM, as described herein.

Various embodiments of the DRAM cache have some or all of the following features.

Transfers to and from storage class memory (SCM) are typically done using very large block sizes. This makes the ratio of tag to data much smaller than in conventional caches, enabling DRAM modifications for cache with little overhead. Various embodiments of a DRAM with data rows and tag rows, and data mat rows and tag mat rows, are shown and described with reference to FIGS. 1-11, and further embodiments with further arrangements of data rows, tag rows, data mat rows and tag mat rows are readily devised for various ratios of tag to data. A controller and DRAM implementing a multiway set associative cache are described in multiple configurations in FIGS. 12-21B.

The DRAM cache is organized as a set associative cache. In a set associative cache, a data set from storage class memory could be cached in a set, and in the set in any of multiple ways, or locations, in cache memory. Multiplying the total number of stats by the total number of ways in each set gives the total number of lines in cache memory. Each way, and each set, maps to a line. A tag matches part of an address of a data set, when the data set is cached, and points to the set and the way or location in cache memory, so that the tagged, cached data set can be read from cache memory. The tag associates the data set to the set and the way or location in cache memory, thus the name for this type of cache. The amount of data that can be cached for a data set, the number of sets, and the number of ways or locations in which that amount can be cached, generally denoted N, determines the amount of cache memory for the N way set associative cache and the number of address bits used in total and for each tag.

Tag storage in the DRAM is done by adding additional rows of cells, either distributed in the existing mats or by adding mats. A mat, whether a data mat with data rows, a tag mat with tag rows, or a mat that has both data rows and tag rows, is a group of DRAM cells of a defined height (number of cells or rows) and width (number of cells or columns). Each DRAM cell has a transistor (generally, NMOS or N type metal oxide semiconductor) and a capacitor. Various embodiments of mats are shown and described with reference to FIGS. 1A-6, and further arrangements of DRAM cells and mats are readily devised.

Associating tag rows with data rows that do not share a primary sense-amplifier avoids the need to double sense-amplifier stripes and saves area. A tag row in a mat with one sense amplifier is associated to and points to a data location elsewhere in DRAM that has another sense amplifier, in some embodiments. This supports timing overlap in the tag sense, through the sense amplifier working for the tag row, and the data sense, through the sense amplifier working for the data location associated to the tag row, as shown in timing details of FIGS. 4 and 5. Such timing overlap would require doubling the sense amplifiers if the tag row and associated data location were in the same mat.

Tags of different ways within a set are located on one row. A tag hit activates a tag match to one of the ways located on this one row, as shown and described with reference to FIG. 3A. This feature supports compare blocks, one for each tag and tag match, to be ganged together in a logical OR configuration for compact circuitry in the compare block shown in FIG. 3A.

Figure 3A:
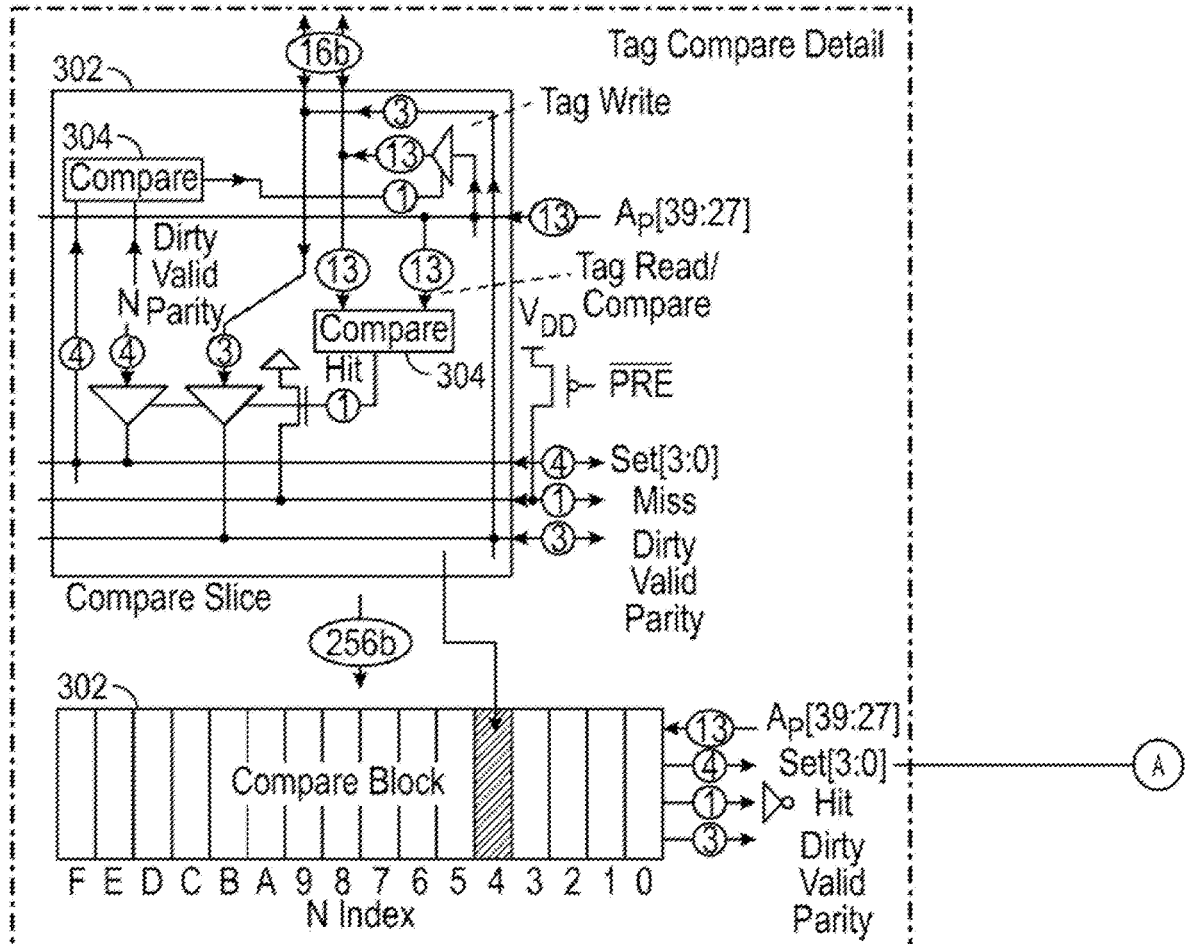
FIG. 3A illustrates circuitry and addressing for a cache hit and access to data of a set that has been cached in a way of the multiway set associative cache, in one embodiment.
Figure 3B:
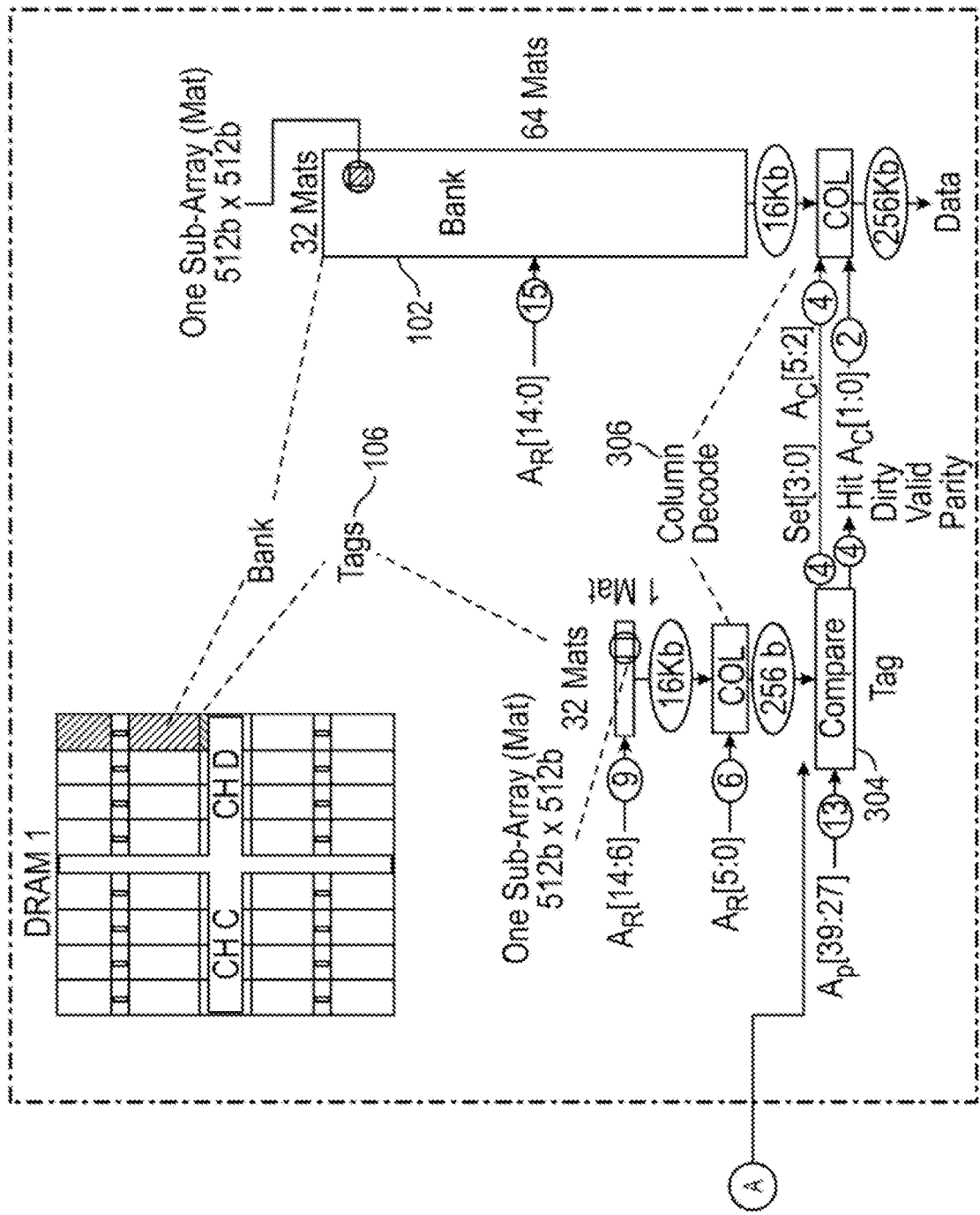
FIG. 3B illustrates the use of set bits from tag data in column decode to access cached data pointed to by the matched tag.

Tag comparison is done with column accesses only. Tags for all of the ways of a specific set are on the same row, and are compared to address bits in parallel across the column accesses of the tag data for that row, as shown in FIGS. 3A and 3B.

Parallel access at the edge of a bank is used to maximize parallel tag comparison. Tags are compared at the edge of each bank, so that multiple tag comparisons can occur across multiple banks in parallel. Cached data is then accessed in multiple banks in parallel, in some embodiments, for example as shown in FIGS. 1A-2C.

Addressing a set uses device, bank and row addresses. Data from storage class memory can be cached in one of N ways or locations, in one of the sets, in the N way set associative cache. The address for set includes a device address, a bank address, and a row address, as decoded through address decoding.

Figure 9:
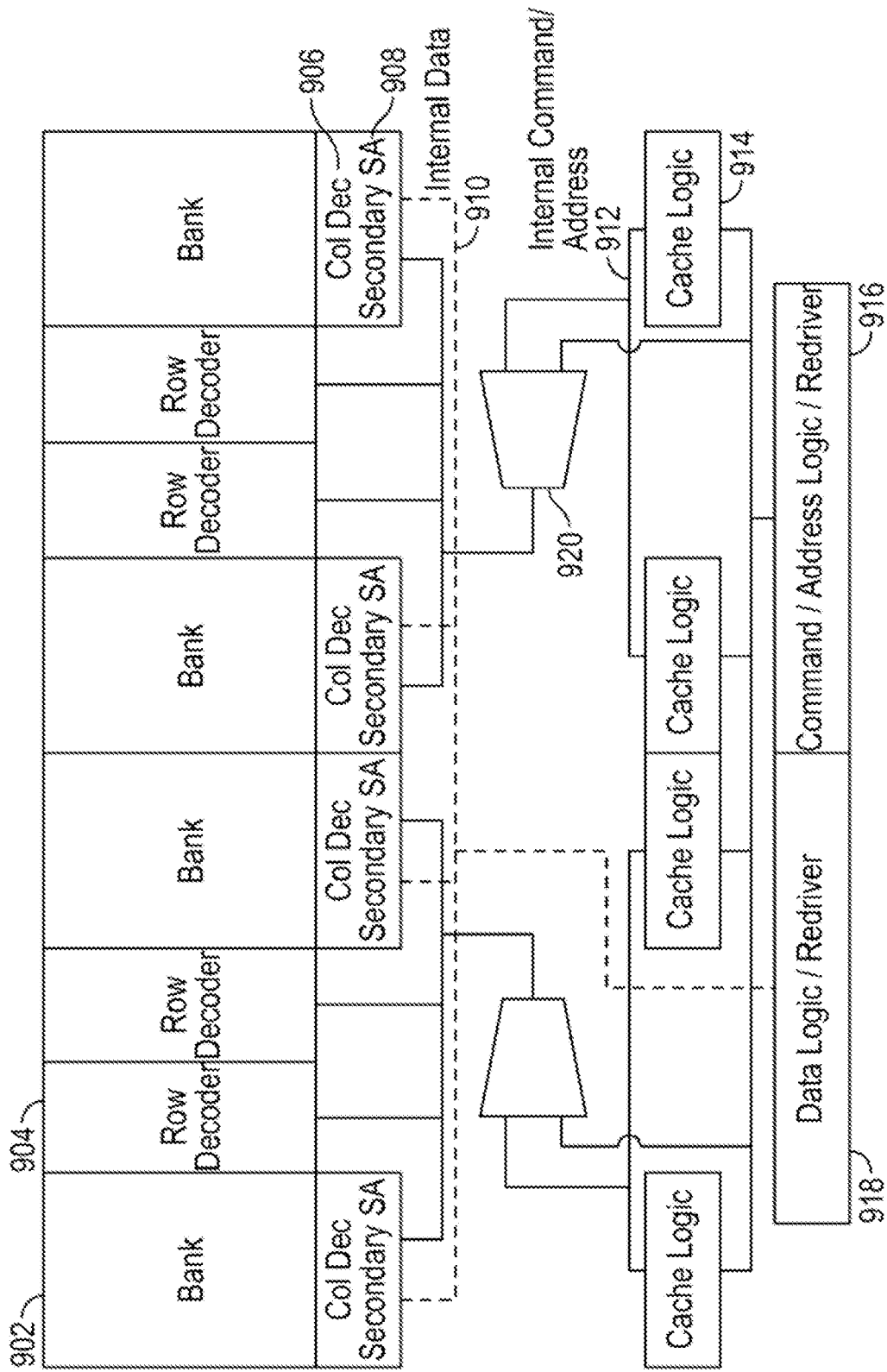
FIG. 9 depicts an embodiment of the multiway set associative DRAM cache.

Set addresses, compare values and addresses determined by tag matching are distributed in the DRAM using the internal address busses. See, for example, FIG. 9 showing cache logic and multiplexing for distributing addresses to row decoding and column decoding for banks in DRAM.

Internal data busses outside of the array and DQ pins are used for data only. See, for example, FIG. 9 showing internal data from banks in the DRAM to data logic. Address and data are not mixed or multiplexed on the data busses.

FIG. 1A illustrates an embodiment of a DRAM with data mat rows 104 (each with multiple data rows) and tag mat rows 106 (each with multiple tag rows for tag information bits), which can be operated as a multiway set associative cache. In this example, each bank 102 of DRAM is an array of 32 mats 108 by 64 mats 108 of DRAM, and each mat 108 is a 512 bit by 512 bit array or sub-array (see FIG. 6), for a total of 256 kilobits (kb) per mat 108. There are eight banks 102 in each of channels A and B of DRAM 0, and eight more banks 102 in each of channels C and D in DRAM 1, for a total of 32 banks 102. The DRAM can perform 64 byte read or write access to 4 kilobyte (kB) DRAM blocks (cache lines). Tags, in tag rows in 32 mats 108 forming a tag mat row 106 at the bottom (or the top, in further embodiments) of the bank 102, take up about 1.6% extra memory cell area in this example.

A DRAM bank 102 is built from an array of mat blocks (sub-array) containing memory cells and row/column peripheral logic. Data wires connect the bank 102 to the interface block. A single row of unmodified mats provides enough capacity and bandwidth (BW) for the tags.

Figure 1B:
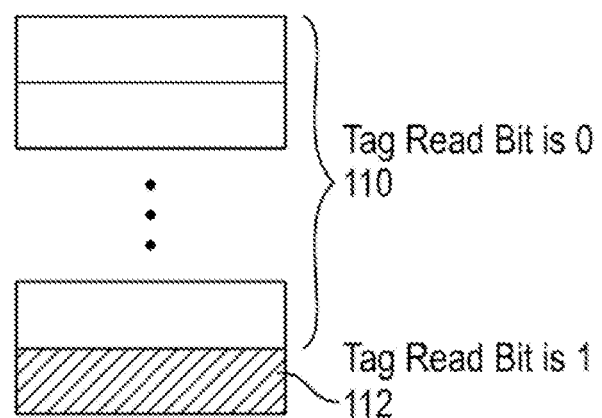
FIG. 1B illustrates tags in a separate tag mat, as suitable for a version of the DRAM embodiment in FIG. 1A.

FIG. 1B illustrates tags in a separate tag mat 112, as suitable for a version of the DRAM embodiment in FIG. 1A. A tag read bit determines whether cached data or tag data is read during a read operation. If the tag read bit is 1, data of a tag in the tag mat 112 is read. If the tag read bit is 0, cached data is read from a data mat 110.

Figure 2A:
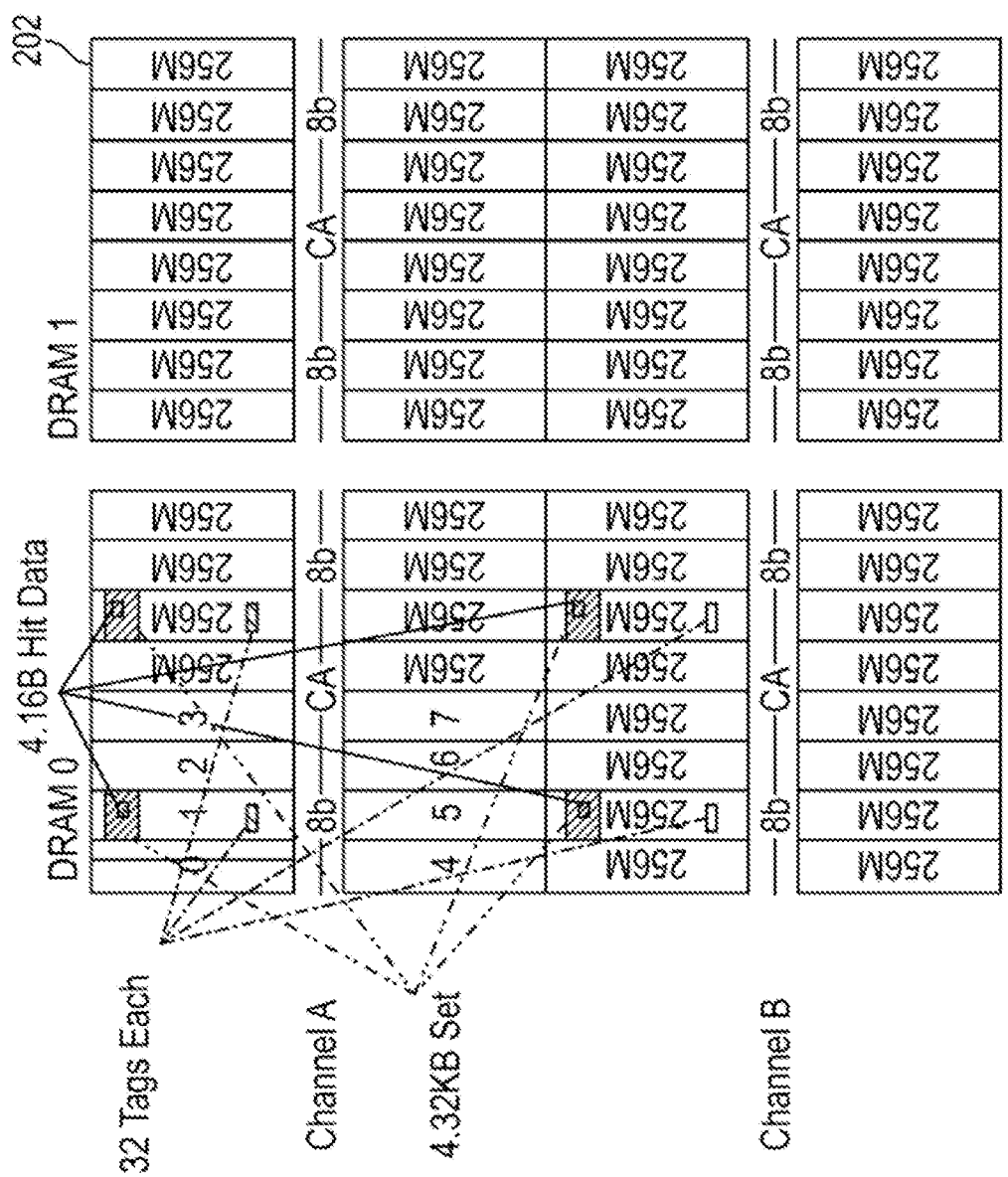
FIG. 2A illustrates a further embodiment of a DRAM with cached data of a set distributed across multiple banks.
Figure 2B:
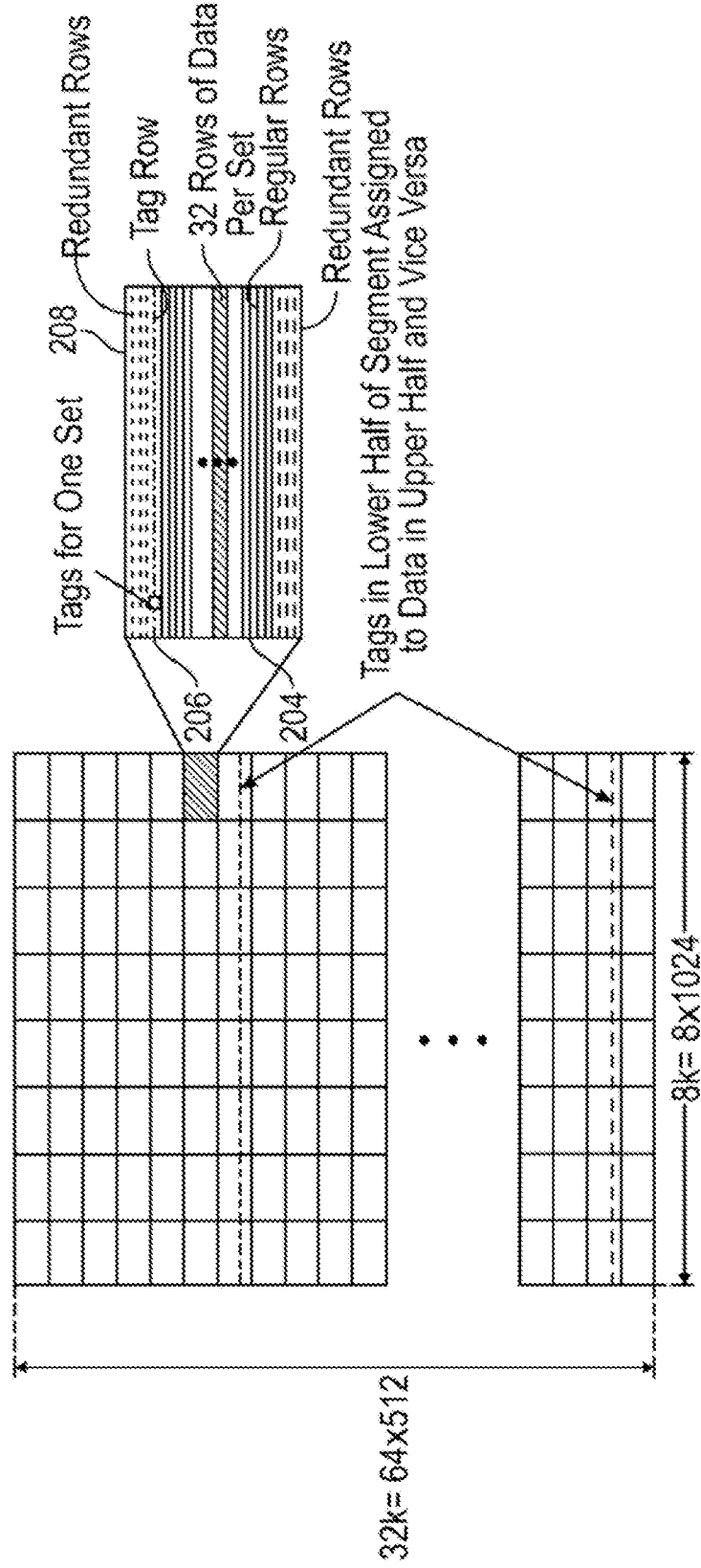
FIG. 2B illustrates data rows and tag rows, as suitable for a version of the DRAM embodiment in FIG. 2A.
Figure 2C:
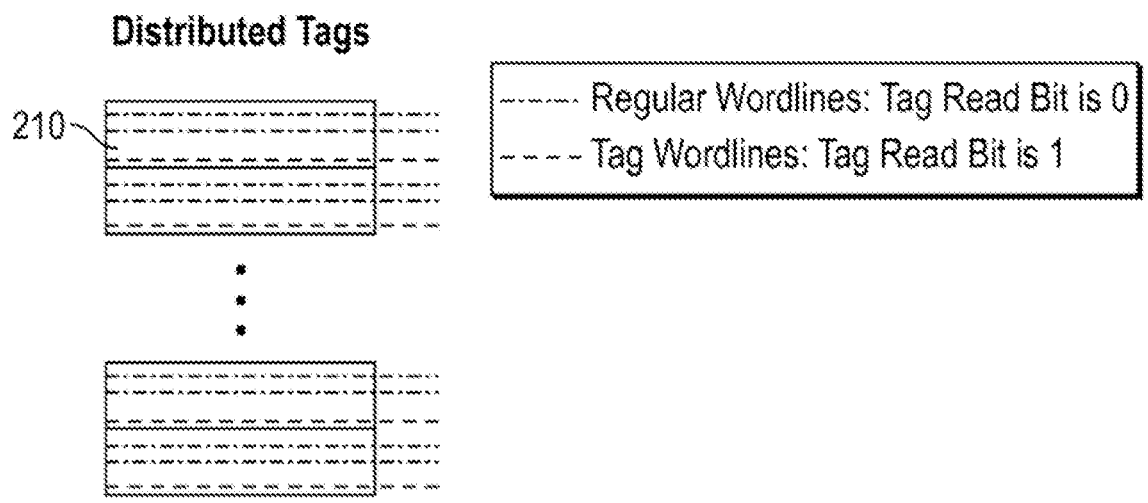
FIG. 2C illustrates distributed tags, as suitable for a version of the DRAM embodiment in FIG. 2A.

In various embodiments, including for tags as shown in FIGS. 1A, 1B, 2A, 2B and 2C, the tags can be read using an access like a normal access (no tag match, direct access from the memory controller to the row address to be activated). In some embodiments, there needs to be an additional address space that signals tag access instead of a normal access. Internally this can be set by a tag read bit as FIG. 1B shows for tags in a separate mat 112, or distributed in mats as shown in FIGS. 2B and 2C, etc. There are multiple options to do this:

1. When DRAM is in cache mode, the bit assignment to decode a sequence of bits sent over the CA bus is modified to have an additional state that signals tag access.
2. When DRAM is in cache mode and there is a bidirectional signal like DMI used to transfer additional information, this signal can be used to switch between cache access and tag read.
3. A mode register set (MRS) switches between cache access and tag read.

FIG. 2A illustrates a further embodiment of a DRAM with cached data of a set distributed across multiple banks 202. In this example, the set is distributed across four banks 202, at 32 kB per bank 202, and each way of the set is distributed as 16 bytes per bank 202 in each of the same four banks 202. Each of these same four banks 202 has 32 tags. Other sets are distributed across other banks 202 of the DRAM, at four banks 202 per set. A tag match, in a tag in each of the four banks 202 occupied by the set, points to cached data of a way of the set, in each of the four banks 202.

FIG. 2B illustrates data rows 204 and tag rows 206, as suitable for a version of the DRAM embodiment in FIG. 2A. This, and other numbers and arrangements of data rows and tag rows in a DRAM as readily devised in keeping with the teachings herein, can be operated as a multiway set associative cache. In this example, each bank 202 of DRAM is an array of eight mats 208 by 64 mats 208, and each mat 208 is a 512 bit by 1024 bit array or sub-array (see FIG. 6), for a total of 512 kb per mat 208. In this example, each mat 208 includes redundant rows at top and bottom, a tag row next to the upper redundant rows, or alternatively next to the lower redundant rows, and regular rows (i.e., data rows), and uses 32 rows of data per set. In various embodiments, a tag row 206 could be at the top, the bottom, or elsewhere in the mat 208. Various arrangements for tag, redundant and regular data rows are possible. In some embodiments, tags in the lower half of a segment (or bank 202) are assigned to data in the upper half of the segment (or bank 202). Tags in the upper half of the segment (or bank 202) are assigned to data in the lower half of the segment (or bank 202). There are 16 banks 202 in each of channels A and B of DRAM 0, and 16 more banks 202 in each of channels A and B of DRAM 1. 32 tags in each of four banks 202 in DRAM 0 can cache a 4 by 32 kB set with 4 by 16 bytes of hit data.

FIG. 2C illustrates distributed tags, as suitable for a version of the DRAM embodiment in FIG. 2A. Regular wordlines (depicted in solid lines) and tag wordlines (depicted in dashed lines) are present in mats 210. Data of a regular wordline can be read when the tag read bit is 0. Data of a tag wordline can be read when the tag read bit is 1. In this embodiment, in a given mat 210, there could be multiple regular wordlines, for cached data, and a single tag wordline, for tag data.

With reference to FIGS. 1A, 1B and 2A-2C, various embodiments have some or all of the following architectural details.

Optimizing the distribution of data units corresponding to one way in the multiway cache (e.g. 64 B transactions within 4 kB way) can be based on tradeoffs between access speed of tag matching, random data access to single unit and access to whole 4 kB blocks vs. bank utilization to allow continuous data streams. For example, the multiway set associative cache DRAM embodiment in FIG. 1A distributes cached data for the ways over all of the banks. The multiway set associative cache DRAM embodiment in FIG. 2A distributes cached data for a given way over only a few banks. One version, in FIG. 1A or variations thereof, can have simultaneous row activation for tags and data, another version, in FIG. 2A or variations thereof can wait until a comparison has a match, to activate a row for cached data access. One version, in FIG. 1A, favors random access to data, another version, in FIG. 2A, favors bank utilization and continuous streams.

Associating the way address with a column address allows full overlap of tag row activation and data row activation but requires either more banks to be accessed or multiple row accesses in the same bank when accessing a full way for fill, for example fetch and evict. Fill involves bringing data into the cache and then getting rid of dirty data at the end.

Tags are replicated as needed so that tag matching can be done locally to where the match information is needed. Multiple banks each have copies of tags for the ways in which data could be cached in that bank, so that whichever bank(s) actually have the tag match can then produce the data. See, for example, FIG. 2A showing tag hits in four banks of the multiway set associative cache DRAM. Each bank has a tag match for a way, and the cached data for that way in all four banks is read in parallel. Each bank has data for all of the ways of a set, but does not have the complete data for each way. In FIG. 1A, tags are replicated 32 times (each of 32 banks has a full, duplicate set of tags) and all of the cached data for a way is available at once, through parallel access to data of a way of a set, in all 32 banks. In FIG. 2A, tags are replicated four times (each of four banks has a duplicate set of a group of tags, each other group of four banks has another duplicate set of another group of tags, etc.), and these four banks are accessed multiple times in order to obtain all of the cached data for the way.

Compare logic is located close to the array edge. For example, the comparators and the compare block (see FIG. 3) are located along an edge of an array of mats of DRAM cells in a bank. Such location shortens signal paths, keeping parasitic signal line loading low, e.g., reducing resistance and capacitance, possibly also reducing incidences of signal reflections.

Feedback to a controller (e.g. hit or miss) is done using available feedback pins (alert (ALERT_n), data mask inversion (DMI), etc.) For example, feedback to the controller can be done using available pins that have a DRAM to controller direction and are not needed in the case of using the DRAM in its cache mode. Examples are using the DMI pins in case of modifying a LPDDR4 DRAM as cache DRAM (see FIG. 11) or using the ALERT_n pin in case of modifying a DDR4 DRAM. A further example is using the error detection code (EDC) pin in the case of modifying a GDDR5 or GDDR6 DRAM.

Writing dirty bit and writing data can start at the same time. The dirty bit is written along with tag data, and the data to be cached is written to the location (or way) in cache memory associated with the tag. If the same bank in the DRAM is used for tag data and cached data, two column cycles may be required pushing out closing of the tag row by one column cycle.

Redundancy: tag rows could get priority replacement or be always doubled up.

DRAM is dual use and can be set in one mode where it works as cache DRAM (e.g., multiway set associative cache mode) or in another mode as standard DRAM (e.g., standard DRAM mode). An embodiment of a mode register, to select standard DRAM mode versus cache DRAM mode, is shown and described with reference to FIG. 7. Mode selection controls address multiplexing and data multiplexing, which differ between these two modes.

Implementation with changes to periphery logic only, from a standard DRAM design layout, is possible if one redundant row per mat is assigned to be a tag row. Standard DRAM design layout has multiple redundant rows, and one of the redundant rows could be designated a tag row, without changing the design layout of the arrangement of mats or rows. Periphery logic can then implement changes to address decoding and data multiplexing, and the addition of comparators and compare blocks for the N way set associative cache operation of the tag rows and remainder of DRAM.

The most recent tag match information can be stored on the DRAM to allow subsequent accesses to the same way without another comparison, in one embodiment. If the cache DRAM is used according to a closed page policy, both tag and data row (way) will be closed after one access. The cache DRAM could also be used according to an open page policy where the data row (way) is kept open after an initial cache hit has occurred. In that case a consecutive column command can be used to access additional columns of the open row. An explicit precharge command will close the data row and the next access will initiate a tag comparison again.

The size of a tag and the bits allocated to address and metadata can be made configurable. An embodiment of a mode register, to select bit length for tags and comparators, corresponding to a configurable number of ways for the multiway set associative cache, is shown and described with reference to FIG. 7.

One embodiment is a DRAM device that supports cache operations, where cache line tags are held in dedicated row storage elements adjacent to associated data row storage elements on separate physical wordlines, that are accessed with two associated operations. The first operation accesses the data of a tag in a tag match and accesses the data rows storage elements. The second operation takes the data of the tag, uses this data to point to columns for the data, and accesses the cached data. These two operations are overlapped in timing shown and described with reference to FIGS. 4A and 5A. The data and cache accesses are thus overlapping, for one of the two associated operations. See, for example, the design in FIG. 1A, where tag and data rows are accessed concurrently, and the tag match activates column decode for the cached data access.

The data and cache accesses are non-overlapping, for the other one of the two associated operations. See, for example, the design in FIG. 2A, which causes a tag match to occur before another row is opened for the cached data access.

One embodiment of the multiway set associative cache has features as follows. 2 GB cache size. This is the amount of DRAM available for caching data from storage class memory. Other sizes of cache are readily devised for further embodiments.

Two 8 Gb LPDDR4 DRAM die. This is the number of dies available for the multiway set associative cache, in one embodiment. Other numbers of dies are readily used for further embodiments.

32 ways. This is the number of ways or addressed locations in each set in cache memory in which data from storage class memory can be cached in the multiway (now 32 way for this embodiment) set associative cache. Other numbers of ways are readily used for further embodiments.

4 kB per way. This is the amount of data that can be cached in each way, or line, in the 32 way or N way set associative cache. Other amounts of data for each way are readily used for further embodiments.

64 B transactions. This is the amount of data that can be read from cache memory, or written to each cache memory, in each (read or write) transaction. Other amounts of data for each transaction are readily used for further embodiments.

Operation compatible with low powered double data rate version 4 (LPDDR4) signaling and timing: one burst with 16 b burst length on two 16 b channels (32 B per channel). In one embodiment, standard timing and signaling for LPDDR4 DRAM is used for both standard DRAM operation and N way set associative cache operation, when enabled. In another embodiment, the DRAM operates as N way set associative cache using standard timing and signaling for LPDDR4 DRAM, but is not selectable for standard DRAM operation without the N way set associative cache operation. Further embodiments could use standard timing and signaling for other types of DRAM as readily devised.

Addressing, including address decoding, and address line multiplexing is readily devised for the following configuration in one embodiment, and other variations in further embodiments.

A 2 GB cache memory is $2^{31}$ bytes=(divided into) $2^5$ ways, with $2^{12}$ bytes of cache memory per way and $2^{14}$ sets. Thus, a 14 b set address identifies the set, and the size of the set is 128 kB. Within a 4 kB way, there are $64=2^6$ possible 64 B transactions. A 6 b offset address identifies the transaction in case of a cache hit.

With a 1 TB SCM size, there is a 40 b address for locations in SCM. The address to match in a tag is 40 b–14 b (number of sets)–12 b (size of way)=14 b. Adding two status bits makes a tag 2 B=16 b. 2 B of tag per 4 kB of data (in each way in this example 32 way set associative cache) is very little overhead for tag storage. Even when tags are stored at multiple location in the DRAM to facilitate parallel access, the overhead will be well below 1%.

Addressing, including address decoding, and address line multiplexing is readily devised for the following configuration in one embodiment, and variations in further embodiments. Addressing of 1 b for device, 3 b for bank, and 10 b for the block of rows belonging to one set identifies a region of 32 1 kB rows per sub-bank. Four sub-banks are simultaneously used in this embodiment.

Depending on how and where data is cached, and design decisions for address multiplexing, bank select, row decode and row enable, and column decode and column enable, there are various possible timings for access to cached data. It is possible to combine multiple embodiments for timing in one device. In one embodiment, there is no overlap between tag compare and access to the cached data in the DRAM. The address of a set of data from main memory (e.g. SCM) which may be cached is separated into bit fields, and one field, a tag field of the address, is presented to the comparators for the tag match. Tags are read and compared to the tag field. A tag match generates part of the address for the cached data in the DRAM, and another part of the address for the cached DRAM comes from the address of the set of data from main memory. Only after all of the address bits are available is the access performed in the DRAM.

In other embodiments, there is full overlap or partial overlap of the access to the tags (i.e., the tag rows) for the tag match and the access for the cached data in the DRAM. Some of the address bits for the set of data in the main memory are used for bank select and row enable in the data rows of the DRAM, in parallel with or starting soon after the access to the tag rows. A tag match generates part of the address for the cached data in the DRAM, and this is used for the column decode to access the cached data.

Various embodiments with various numbers of tag address bits for compare, numbers of ways in a set, numbers of flag bits, arrangements of address bits for column and row decodes, designs and functions for sense amplifiers, etc., are presented herein. It should be appreciated that these are examples, and that further embodiments are readily devised in light thereof.

FIG. 3A illustrates circuitry and addressing for a cache hit and access to a data of a set that has been cached in a way of the multiway set associative cache, in one embodiment. The tag mats are identical to the normal data mats of the bank. For example in the embodiment shown, each mat 108 is a 512 bit by 512 bit array or sub-array (see FIG. 6), for a total of 256 kilobits (kb) per mat. The tag array allows a 16 kb row to be accessed from the bank, and a 256 b column from the row. The 256 b column contains sixteen 16 b tags 106, each of which could be a possible match for the physical address AP[39:27] field of the access. Tags are accessed using nine address bits $A_R[14:6]$ for row decode and six bits $A_R[5:0]$ for column decode 306. Tags are read in parallel and compared in parallel, with each tag access providing 16 bits, 13 of which are presented to a comparator 304 in a compare block 302 for comparison to the AP[39:27] address field, and the other three of which are flag bits (e.g., dirty, valid, parity). A further embodiment could use 14 bits for address comparison, leaving two flag bits. Other numbers of tag bits, address comparison bits and flag bits are readily envisioned.

FIG. 3B illustrates the use of set bits from tag data in column decode to access cached data pointed to by the matched tag. A matching tag 106 is a HIT, and the set number (from 0 thru 15) Set[3:0] is passed by the compare blocks 302 to the column access path for the bank, column decode 306. In the circuitry shown, each compare block 302 is hardwired with a set number N, which is enabled onto the set number bits Set[3:0] by a hit in that compare block 302. The matching data is then accessed. Comparison and data access can happen in multiple banks 102 in parallel, in various embodiments (e.g., see FIGS. 1A, 2A, 9 and 10).

Figure 3C:
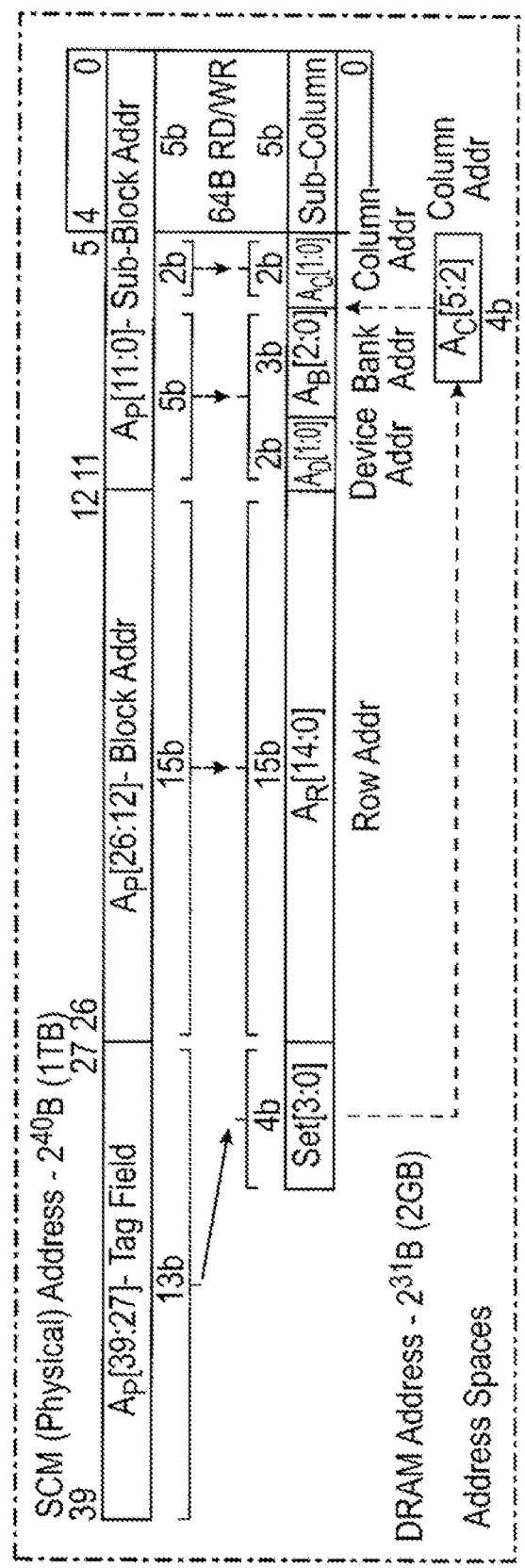
FIG. 3C illustrates address spaces in SCM and DRAM, for accessing data of SCM that is cached in the multiway set associative cache DRAM, according to one embodiment.

FIG. 3C illustrates address spaces in SCM and DRAM, for accessing data of SCM that is cached in the multiway set associative cache DRAM, according to one embodiment. In one embodiment, the SCM physical address is 40 bits $A_P[39:0]$, to address $2^{40}$ bytes (1 TB) of SCM. To access cached data, the 13 most significant bits $A_P[39:27]$ are used as a tag field, which generates Set[3:0], used for the column address bits $A_C[5:2]$ of the cached data. The block address, 15 bits of the SCM physical address, $A_P[26:12]$ is used for the row address $A_R[14:0]$ of the cached data. The five most significant bits of the sub block address of the SCM physical address, $A_P[11:6]$ provide two bits for the device address $A_D[1:0]$ and three bits for the bank address $A_B[2:0]$ of the cached data. The next two bits of the sub block address of the SCM physical address provide two more bits for the column address of the cached data, $A_C[1:0]$. Column decode 306 uses address bits $A_C[5:2]$ and $A_C[1:0]$. All sets are available in the DRAM cache after tag compare.

Figure 4A:
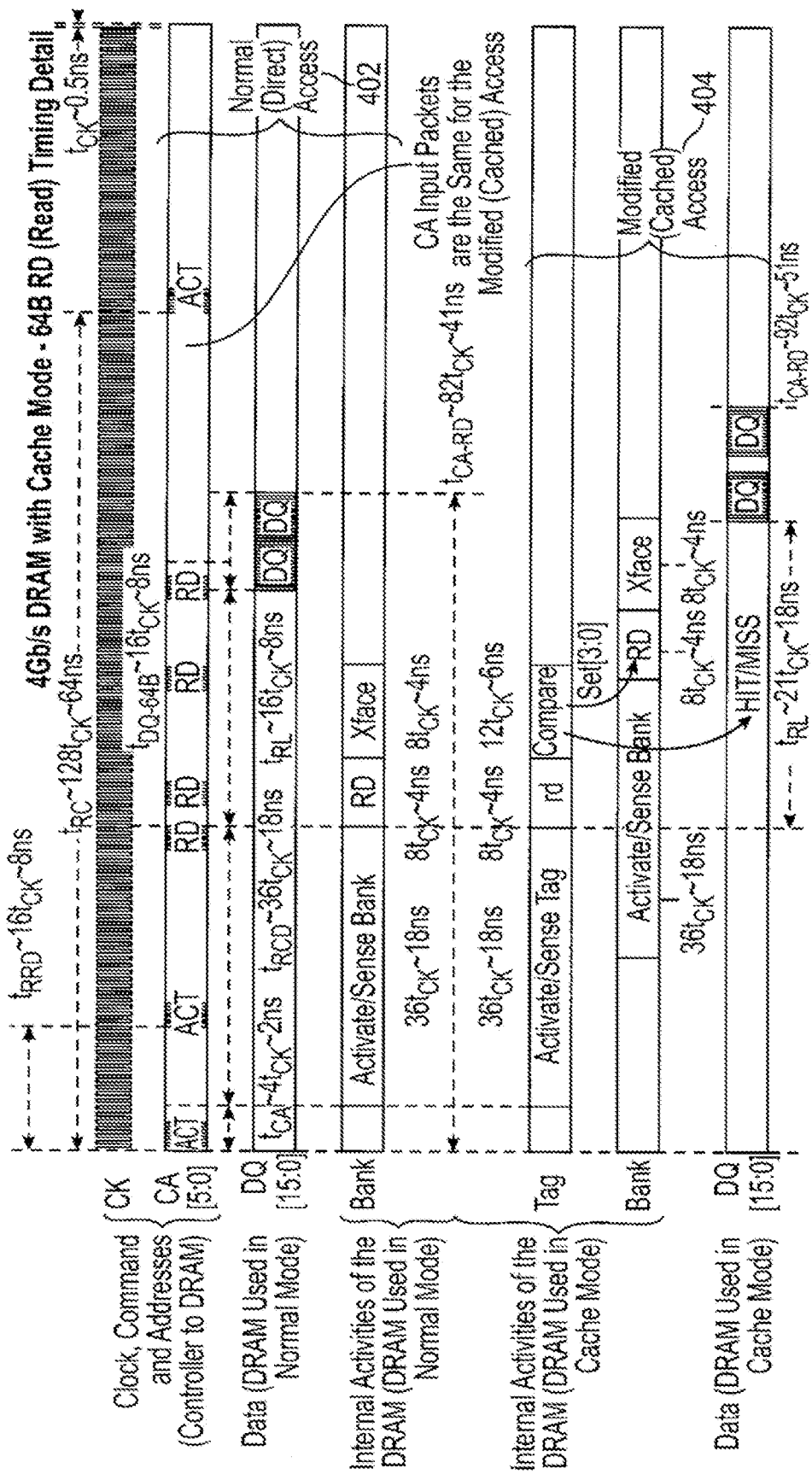
FIG. 4A is a read timing detail illustrating a normal access of data and a modified access of cached data, in one embodiment.

FIG. 4A is a read timing detail illustrating a normal access 402 of data and a modified access 404 of cached data, in one embodiment. A copy of a 4 kB block in DRAM (cache memory) is distributed across 32 banks 102 for better performance. In the embodiment shown, the 4 kB block is composed of mats, and each mat 108 is a 512 bit by 512 bit array or sub-array (see FIG. 6), for a total of 256 kilobits (kb) per mat. Further arrangements of banks, blocks and mats are readily devised. Column decode 306 is as described above with reference to FIG. 3A. Tags in tag mat rows 106 are as described above with reference to FIG. 1A. Variations for further embodiments are readily devised.

FIG. 4A shows a clock signal CK, grouped with command/address CA as clock, command and addresses (controller to DRAM), data bus DQ as data (DRAM used in normal mode), and bank control Bank as internal activities of the DRAM (DRAM used in normal mode), for a normal (direct) access 402 for reading data. Below these are tag activity Tag, grouped with bank control Bank as internal activities of the DRAM (DRAM used in cache mode), and data bus DQ as data (DRAM used in cache mode), for a modified (cached) access 404 for reading cached data. According to the bank control, for the normal (direct) access 402, there is first an activate and sense of the bank, followed by a read and transfer to the interface Xface. Xface in the timing diagrams denotes the time it takes inside the DRAM for data from coming out of the array to showing up on the external DQ (read), e.g., FIG. 4A, or from coming in on the external DQ to being at the array (write), e.g., FIG. 5A.

Figure 5A:
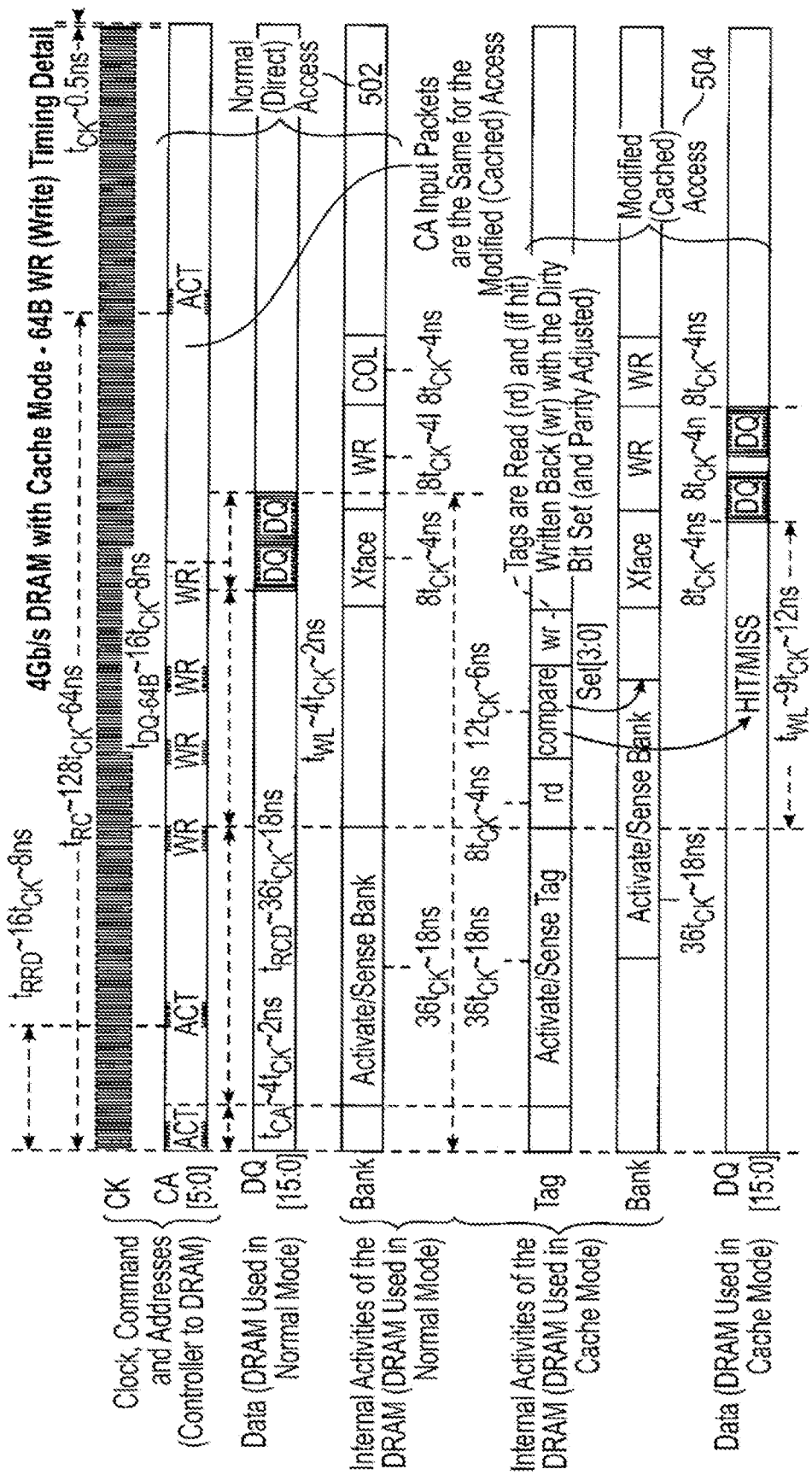
FIG. 5A is a write timing detail illustrating a normal access of data and a modified access of cached data, in one embodiment.

The timing for a normal (direct) access 402 read delivers two columns of data in 41 ns, with the activate and sense of the bank 102 taking 36 clock cycles or 18 ns, read taking eight clock cycles or 4 ns, and transfer to the interface (xface) taking eight clock cycles or 4 ns. FIGS. 4A and 5A show CA[5:0] as an example of the transfer of command and address from the controller to the DRAM following an LPDDR4 protocol. If DRAMs of another protocol are modified to be usable as cache DRAM, these functions could be done using explicit address pins and separate command pins like RAS, CAS and WE.

According to the tag activity, for the modified (cached) access 404, there is first an activate and sense of the tag, followed by a read of the tag data and compare, in which the determination of a tag hit or miss is made. CA input packets are the same for the normal (direct) access 402 as for the modified (cached) access 404. Overlapped with this activity, according to the bank control, there is the activate and sense of the bank, with a tag hit providing the set bits Set [3:0], followed by a data read of the cached data, and the transfer to the interface Xface. The timing for a modified (cached) read access 404 is 51 ns, with activate and sense of the tag taking the same 36 clock cycles or 18 ns that a read of data in a normal access 402 takes, followed by tag compare taking 12 clock cycles or 6 ns. Timing is overlapped for the cached data access, with activate and sense of the bank 102 taking the same 36 clock cycles or 18 ns but overlapped with the activate and sense of the tag, followed by the same eight clock cycles or 4 ns for the read, and the same eight clock cycles or 4 ns for the transfer to the interface (Xface). The extra 10 ns (for the overall time for the access to read cached data) includes 4 ns for a column access and 6 ns for a 16 b compare.

Figure 4B:
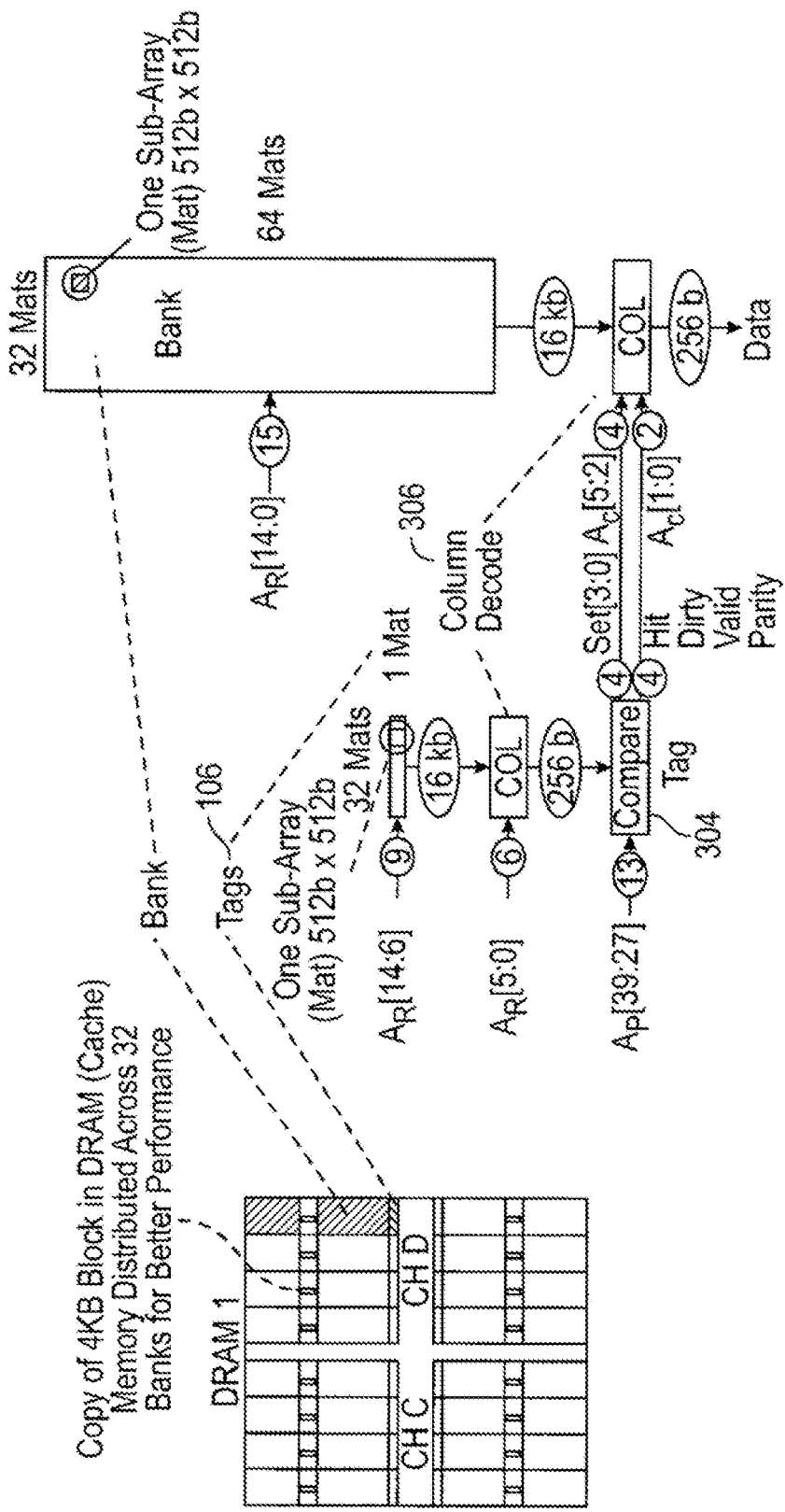
FIG. 4B illustrates reading cached data from one of the banks of the multiway set associative cache DRAM, while more of the cached data is read in parallel from other banks, using the read timing shown in FIG. 4A.

FIG. 4B illustrates reading cached data from one of the banks of the multiway set associative cache DRAM, while more of the cached data is read in parallel from other banks, using the read timing shown in FIG. 4A. A copy of a 4 kB block of data from SCM is distributed across 32 banks in the DRAM (cache) memory, for better performance, in one embodiment (see, e.g., FIG. 1A). 256 bits of tag data are read out in parallel from the bank, using selected address bits for mat (and tag row) selection and column decode 306. A tag match, for one of the tags 106, produces indication of a hit (i.e., a cache hit, tag match or tag hit, see FIG. 3A) and set bits Set[3:0], along with dirty, valid and parity bits in one embodiment. The set bits are combined with specified address bits for column decode 306, and 256 bits of cache data are read out from the bank. Similar activity occurs across 32 banks of DRAM, resulting in the reading, in parallel, of the 4 kB block of cached data. Variations, with different numbers of bits and different addressing and timing schemes are readily developed for further embodiments of the multiway set associative DRAM cache, including the embodiment shown in FIG. 2A.

FIG. 5A is a write timing detail illustrating a normal access 502 of data and a modified access 504 of cached data, in one embodiment. A copy of a 4 kB block in DRAM (cache memory) is distributed across 32 banks 102 for better performance. In the embodiment shown, the 4 kB block is composed of mats, and each mat 108 is a 512 bit by 512 bit array or sub-array (see FIG. 6), for a total of 256 kilobits (kb) per mat. Further arrangements of banks, blocks and mats are readily devised. Further arrangements of banks, blocks and mats are readily devised. Column decode 306 is as described above with reference to FIG. 3A. Tags in tag mat rows 106 are as described above with reference to FIG. 1A. Variations for further embodiments are readily devised.

FIG. 5A shows a clock signal CK, grouped with command/address CA as clock, command and addresses (controller to DRAM), data bus DQ as data (DRAM used in normal mode), and bank control Bank as internal activities of the DRAM (DRAM used in normal mode), for a normal (direct) access 502 for writing data. Below these are tag activity Tag, grouped with bank control Bank as internal activities of the DRAM (DRAM used in cache mode), and data bus DQ as data (DRAM used in cache mode), for a modified (cached) access 504 for writing cached data. According to the bank control, for the normal (direct) access 502) there is first an activate and sense of the bank, followed by a transfer to the interface Xface, a write and a column access. The timing for a normal (direct) write access 502 stores two columns of data in 34 ns, with the activate and sense of the bank 102 taking 36 clock cycles or 18 ns, a waiting period, a transfer to the interface (Xface) taking eight clock cycles or 4 ns, write WR of eight clock cycles or 4 ns, and column COL of eight clock cycles or 4 ns.

According to the tag activity, for the modified (cached) access 504, there is first an activate and sense of the tag, followed by a read of the tag data and compare, in which the determination of a tag hit or miss is made. CA input packets are the same for the normal (direct) access 502 as for the modified (cached) access 504. Overlapped with this activity, according to the bank control, there is the activate and sense of the bank, with a tag hit providing the set bits Set [3:0], followed by a transfer to the interface (Xface) and two write cycles to write the cached data. Xface in the timing diagram denotes the time it takes inside the DRAM for data from coming out of the array to showing up on the external DQ (read), e.g., FIG. 4A, or from coming in on the external DQ to being at the array (write), e.g., FIG. 5A. The second WR in "Bank" for the modified (cached) access 504 is for the tag write WR. There is a difference between the line above labeled "Tag" and the line labeled "Bank". The line "tag" shows what happens in the tag logic, i.e. for WR the tag needs to be read, compared and a new tag with dirty bits etc. set needs to be prepared. The line "bank" shows what's going on in the array. FIG. 4A and FIG. 5A both read the tag, but the line "Bank" of FIG. 4A and FIG. 5A does not show the tag read (it would be underneath the "Activate/Sense Bank" block as the tag is read while the data row is activated and sensed).

The timing for a modified (cached) write access 504 is 44 ns, with activate and sense of the tag taking the same 36 clock cycles or 18 ns that a read of data in a normal access 502 takes, followed by tag read taking eight clock cycles or 4 ns and tag compare taking 12 clock cycles or 6 ns. This is followed immediately by the write wr, taking eight clock cycles or 4 ns. Tags are read (rd) and (if hit) written back (wr) with the dirty bit set and parity adjusted. Hit or miss status is returned to the controller. If there is a miss, the 64 byte write and tag write dirty operations are canceled. The extra 10 ns (for the overall time for the access to write cached data) includes 4 ns for a column access and 6 ns for a 16 b compare. The 16 b tag is written back with its "dirty" flag set—this might increase the tRC of the tag access in some embodiments.

Figure 5B:
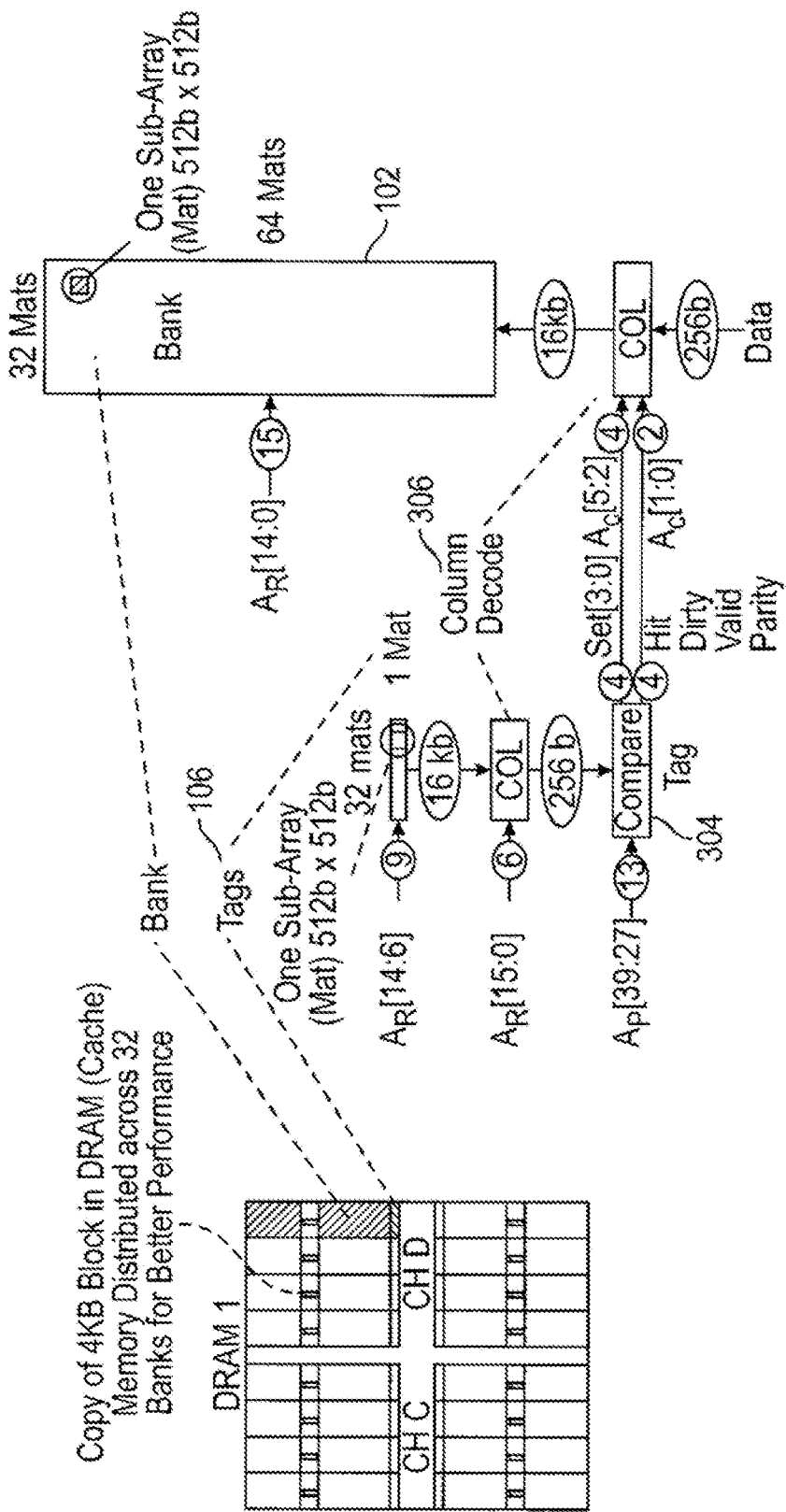
FIG. 5B illustrates writing cache data to one of the banks of the multiway set associative cache DRAM, while more of the cache data is written in parallel to other banks, using the write timing shown in FIG. 5A.

FIG. 5B illustrates writing cache data to one of the banks of the multiway set associative cache DRAM, while more of the cache data is written in parallel to other banks, using the write timing shown in FIG. 5A. A copy of a 4 kB block of data from SCM is distributed across 32 banks in the DRAM (cache) memory, for better performance, in one embodiment (see, e.g., FIG. 1A). 256 bits of tag data are read out in parallel from the bank, using selected address bits for mat (and tag row) selection and column decode 306. A tag match, for one of the tags 106, produces indication of a hit (i.e., a cache hit, tag match or tag hit, see FIG. 3A) and set bits Set[3:0], along with dirty, valid and parity bits in one embodiment. The set bits are combined with specified address bits for column decode 306, and 256 bits of cache data are written into the bank. If appropriate to a hit, the newly prepared tag with dirty bit and adjusted parity, etc. is also written back to the bank. Similar activity occurs across 32 banks of DRAM, resulting in the writing, in parallel, of the 4 kB block of cache data. Variations, with different numbers of bits and different addressing and timing schemes are readily developed for further embodiments of the multiway set associative DRAM cache, including the embodiment shown in FIG. 2A.

Figure 6:
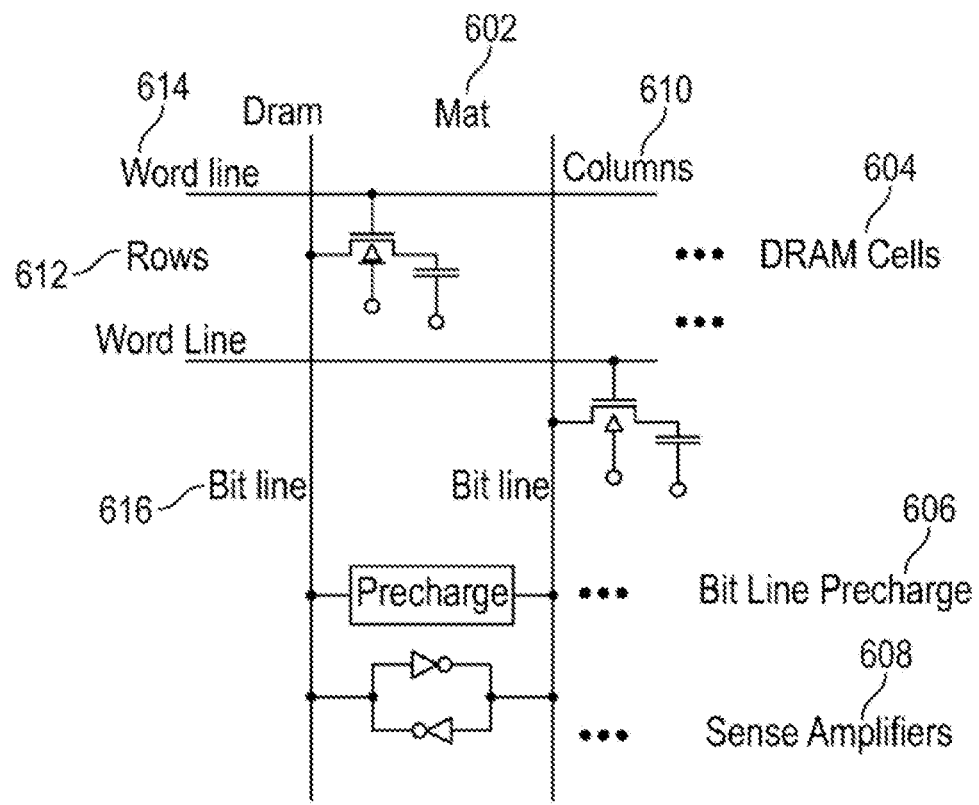
FIG. 6 illustrates DRAM cells and sense amplifiers in a mat, which can be used in embodiments of the DRAM.

FIG. 6 illustrates DRAM cells 604 and sense amplifiers 608 in a mat 602, which can be used in embodiments of the DRAM. DRAM cells 604 are arranged in rows 612 and columns 610. Each DRAM cell 604 has a MOSFET and a capacitor, which can store a charge. The DRAM cell 604 in a given row 612 is activated by the word line 614 for that row 612, and reads out onto the bit line 616 for that column 610 of DRAM cells 604. All of the bit lines 616 are pre-charged by the bit line precharge 606, and selected DRAM cells 604 are read out through the sense amplifiers 608. Sense amplifiers 608 may have further circuitry. Generally, a sense amplifier will have three functions, precharge, sense and connection to array data lines, and various sense amplifier designs are readily implemented for various embodiments. Of note is that in this design, each mat 602 has sense amplifiers 608 specific to the DRAM cells 604 of the mat 602. It is thus possible to arrange a tag mat row 106 with one set of mats 602 and data rows 104 associated to tags, i.e., as tag rows, with other sets of mats 602, so that each tag and tag mat row 106 is coupled to a sense amplifier (i.e., sense amplifiers 608 for the set of mats 602 making up the tag mat row 106) and the associated data rows are coupled to a different sense amplifier (i.e., sense amplifiers 608 for those sets of mats 602 making up the data mat rows 104), and access to tags can be overlapped with access to cached data pointed to by the tags.

In various embodiments, there are different ways of avoiding sense-amplifier conflicts. FIGS. 1A and 1B may have a tag mat and a data mat adjacent to each other, so they may need to have a double up sense-amplifier stripe only at that border, nowhere else in the bank. FIG. 2 and other possible embodiments do not need to double up the usual interleaved sense-amplifier since they are architected in a way that tags are never adjacent to the related data. Having adjacent mats that are operated at the same time in a 6F2 open bitline architecture requires the overhead of dummy arrays to provide complement bitlines and has therefore quite a bit of overhead.

Figure 7:
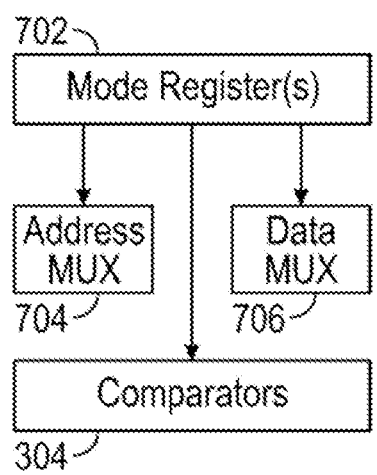
FIG. 7 illustrates a mode register for selection of standard DRAM mode, or multiway set associative cache mode with adjustable bit length of tags and comparators.

FIG. 7 illustrates a mode register 702 for selection of standard DRAM mode, or multiway set associative cache mode with adjustable bit length of tags and comparators. One or more mode registers 702 control an address multiplexer (mux) 704, a data multiplexer (mux) 706, and the comparators 304. Address bits for row decode and row enable, and column decode and column enable, in tag access and cached data access, and selection of number and position of data bits for tag compares (see FIGS. 3A-5B) are thus controlled according to mode selection, through the address multiplexer 704 and/or the data multiplexer 706. In various embodiments, there could be a specified range of bit length for tags and comparators 304, corresponding to a range of numbers of ways for the multiway set associative cache. The mode register 702 could select numbers of bits for tag comparison or numbers of ways in a set. For example, a higher performance solution could be converted from 32 way to 16 way with twice the number of sets. The same DRAM could be used as a standard DRAM, compatible with a specified DRAM timing and signaling and the comparators disabled, or used as a multiway set associative cache with the comparators enabled, or even switched back and forth between the two modes. In a further embodiment, some or all of these features could be enabled or selected using fuse logic, instead of a mode register 702.

Figure 8A:
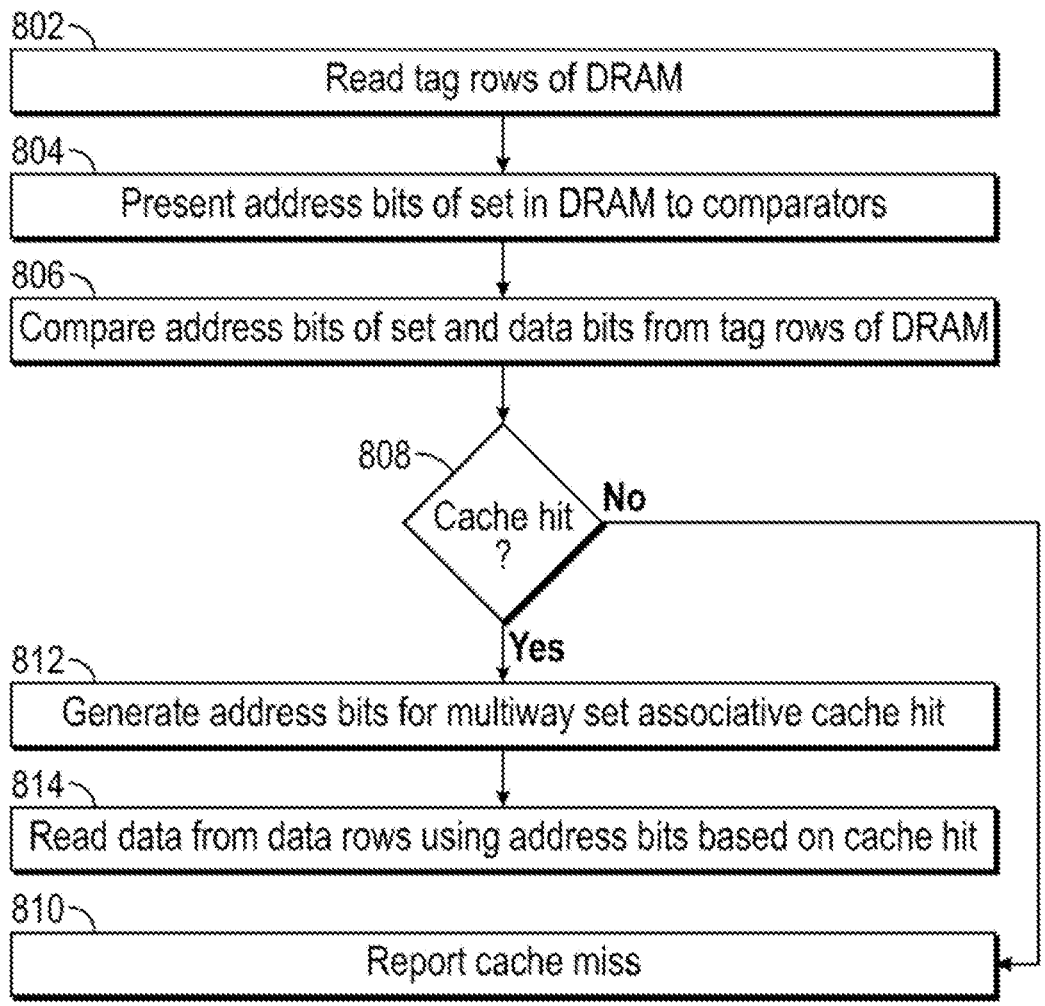
FIG. 8A is a flow diagram of a method of operating a multiway set associative DRAM cache, which can be practiced by various embodiments described herein.

FIG. 8A is a flow diagram of a method of operating a multiway set associative DRAM cache, which can be practiced by various embodiments described herein. For example, hardware, software executing on a processor, firmware, or combination thereof can perform these various actions, using timing and circuits as shown in FIG. 3A, 4A or 5A, or variation thereof to perform an access of cached data in a DRAM as shown in FIGS. 1A-7 or variation thereof. In an action 802, tag rows of the DRAM are read. Tag rows are read in parallel, and could be located as depicted in and FIGS. 1A and 2A, or in variations thereof. An example of the read timing for the action 802 is shown in FIG. 4A, for the modified (cached) access 404, in which the tag activity shows activate/sense tag, followed by read (rd).

Figure 8B:
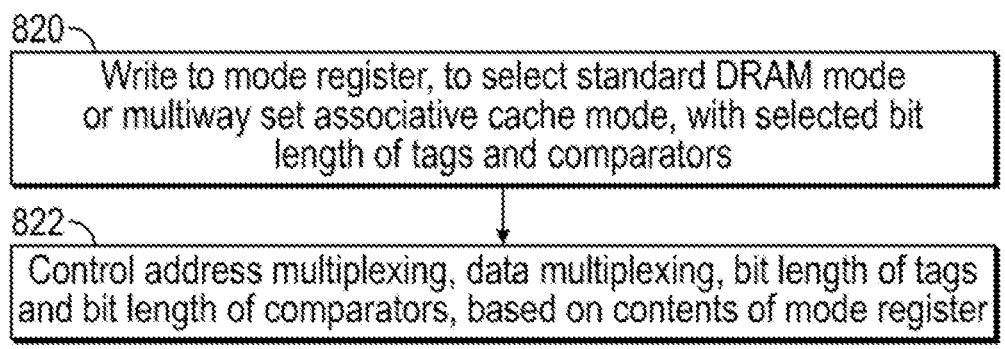
FIG. 8B is a flow diagram of selecting an operating mode, which can be practiced by various embodiments described herein.

In an action 804, address bits of a set that may be cached (e.g., from main memory or SCM) in DRAM are presented to the comparators. Selection of address bits could be controlled as shown in FIG. 7 or FIG. 8B, or variation thereof. An example of the read timing for the action 804 is shown in FIG. 4A, for the modified (cached) access 404, in which the tag activity shows read (rd), followed by compare.

In an action 806, the address bits of the set and the data bits (i.e., tag information bits) from the tag rows of the DRAM are compared. Comparators as shown in FIGS. 3A-5B perform the comparisons in parallel across banks of the DRAM. An example of the read timing for the action 806 is shown in FIG. 4A, for the modified (cached) access 404, in which the tag activity shows compare, with a tag hit providing the set bits Set [3:0].

In a decision action 808, it is determined if there is a cache hit. Cache hit is determined from results of the comparisons in the action 806. An example of this timing is shown in FIG. 4A, for the modified (cached) access 404, in which the compare is performed to determine whether there is a cache hit or a cache miss. If the answer is no, there is no cache hit, flow proceeds to the action 810, to report cache miss. If the answer is yes, there is a cache hit, flow proceeds to the action 812.

In the action 812, address bits are generated for the multiway set associative cache hit. FIGS. 3A-5B show examples of generation of set bits Set [3:0] showing which way of the multiway set associative cache has the set of cached data.

In an action 814, data is read from data rows using address bits based on the cache hit. FIGS. 3A-5B show examples with column decode for reading cache data. An example of this timing is shown in FIG. 4, for the modified (cached) access 404, in which the DQ bits are read onto the DQ bus after a cache hit.

FIG. 8B is a flow diagram of selecting an operating mode, which can be practiced by various embodiments described herein. In an action 820, the mode register is written to, to select standard DRAM mode or multiway set associative cache mode, with selected bit length of tags and comparators.

In an action 822, address multiplexing, data multiplexing, the bit length of tags and bit length of comparators are controlled, based on contents of the mode register. FIG. 7 shows an example of a mode register controlling these aspects.

FIG. 9 depicts an embodiment of the multiway set associative DRAM cache. Four banks 902 are shown, each with a row decoder 904. Each bank 902 has a column decode 906 and secondary sense amplifier (SA) 908. Each bank 902 also has cache logic 914. This example shows one multiplexer 920 per two banks 902, but could have one multiplexer 920 per bank or per any number of banks 902 in further embodiments. Internal command and address lines, from command/address logic/re-driver 916 connect to logic at the edge of the array (for bank control, decoder and row decoder), either from cache logic or from global command and address logic and re-driver 916. Internal data lines 910 connect secondary sense amplifiers to global data logic and re-driver 918, not to cache logic 914.

Figure 10:
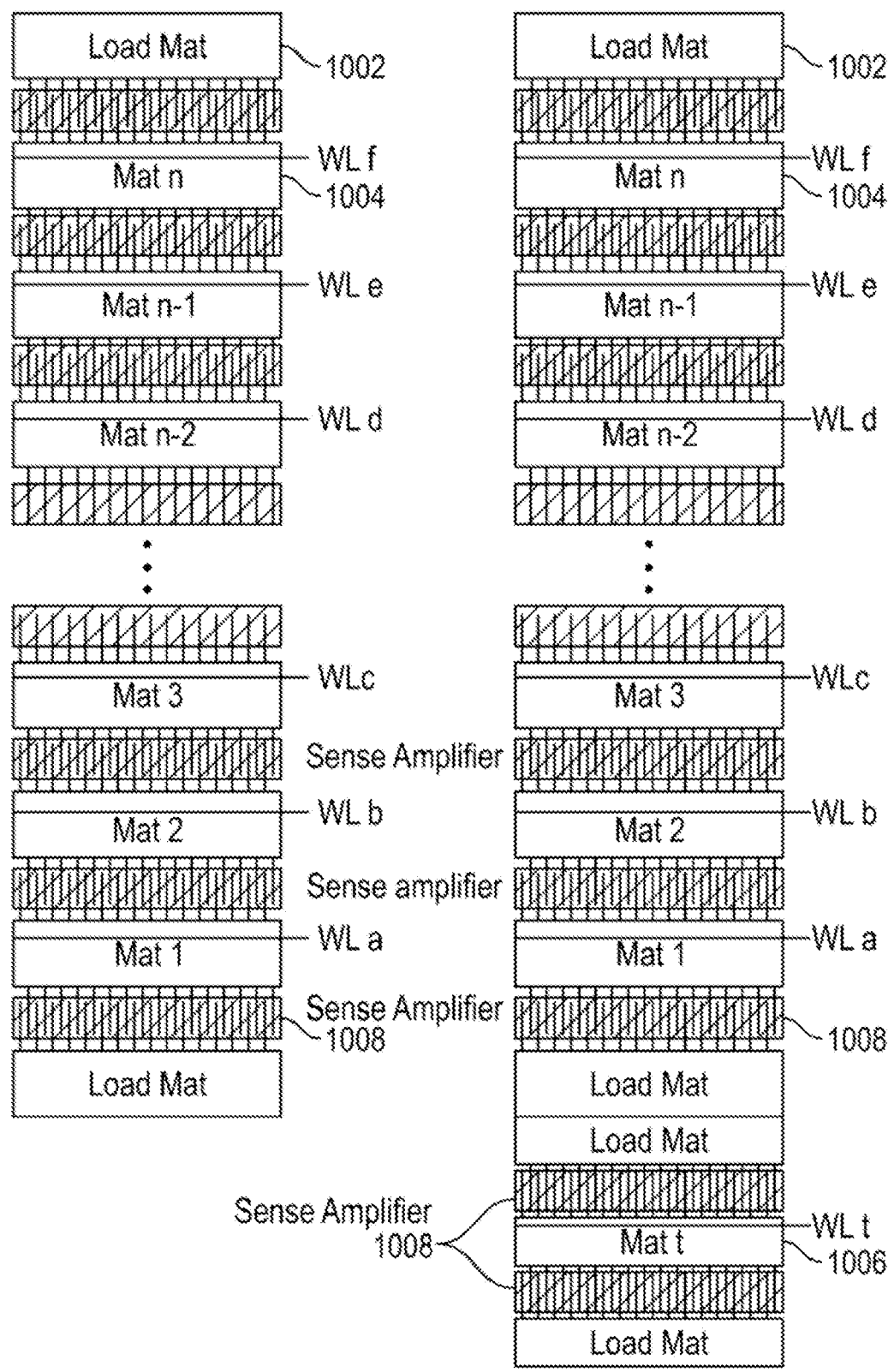
FIG. 10 depicts a further embodiment of the multiway set associative DRAM cache.

FIG. 10 depicts a further embodiment of the multiway set associative DRAM cache. Sense amplifiers 1008 are shared between neighboring mats 1004. Load mats 1002 are necessary at the edge of the bank. Activating a wordline (WL)

blocks assessing wordlines sharing a sense amplifier 1008, e.g., WL b blocks both WL a and WL c.

Options for an embodiment of the multiway set associative DRAM cache (see left side of FIG. 10) include the following. Option A) Mat 1 and mat n store tags, mat 1 stores tags for data in mats 2 to n/2, and mat n stores tags for data in mats n/2+1 to n−1. Option B) Only mat 1 stores tags, mat 2 is a load mat shared between mat 1 and mat 3, and data are stored in mats 3 to n. Option C) Tags are distributed as extra row in all tags, tags for data in mats 1 to n/2 are in mats n/2+1 to n, and tags for data in mats n/2+1 to n are in mats 1 to n/2.

Options for an embodiment of the multiway set associative DRAM cache (see right side FIG. 10) include the following. Option D) Mat t 1006 stores tags (i.e., tag mat), mat t 1006 has different number of wordlines than mats 1 to n, mat t 1006 needs its own load mats with the same number of wordlines to have balanced load (cutting load bit lines and sharing load mat may create a process issue), and data are stored in mats 1 to n.

Figure 11:
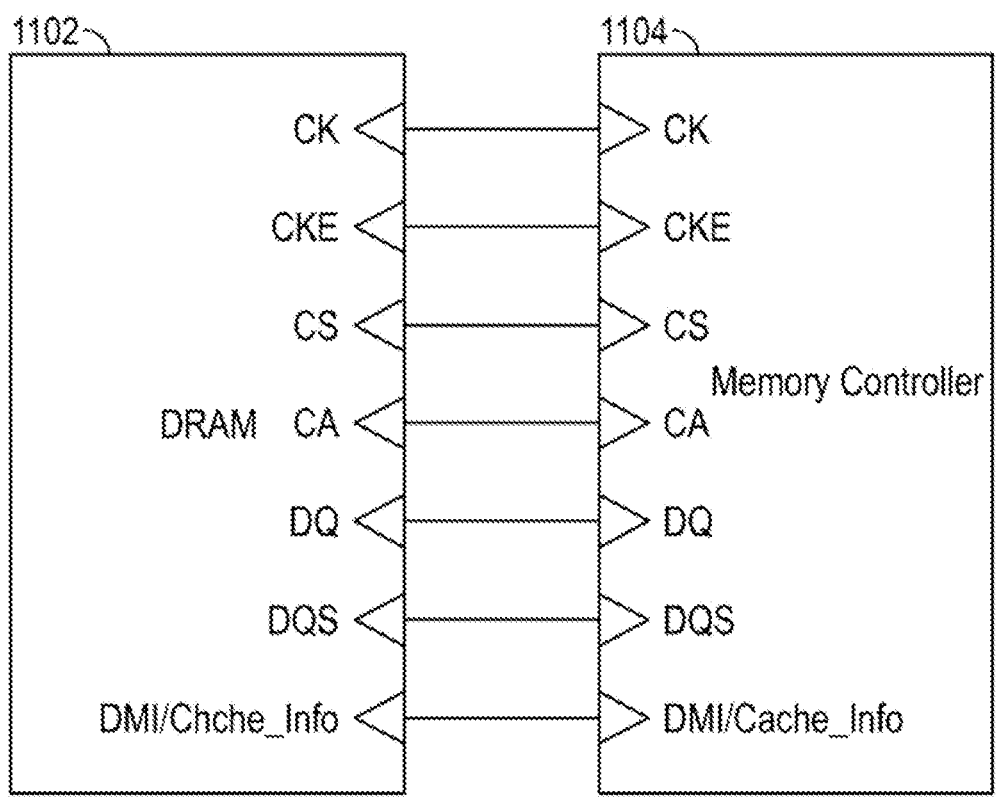
FIG. 11 depicts a DRAM, and a memory controller that can operate the DRAM as a multiway set associative DRAM cache in accordance with present embodiments.

FIG. 11 depicts a DRAM 1102, and a memory controller 1104 that can operate the DRAM 1102 as a multiway set associative DRAM cache in accordance with present embodiments. In some versions, the DRAM 1102 is operated as a multiway set associative DRAM, and in other versions the DRAM 1102 can be operated selectably as either a standard DRAM or a multiway set associative DRAM (see, e.g., description of mode register 702 in FIG. 7). Signal lines connecting corresponding pins on both the DRAM 1102 and memory controller 1104 include CK, CKE, CS, CA, DQ, DQS, and DMI (see DRAM standards below). In this embodiment, the DMI signal and pin are repurposed for communicating cache information, and labeled DM/CACHE_INFO.

One example DRAM standard that is suitable for embodiments of the DRAM 1102 is the JEDEC standard number 209-4B, for LPDDR4 (low-power double data rate version 4) DRAM, summarized below. Additional information is available under the published standard.

Clock, input, symbol CK_t_A, CK_c_A, CK_t_B, CK_c_B. Differential clock inputs, with each channel (A and B) having its own clock pair.

Clock Enable, input, symbol CKE_A, CKE_B. Each channel (A and B) has its own clock enable signal.

Chip Select, input, symbol CS_A, CS_B. Each channel (A and B) has its own chip select signal.

Command/Address Inputs, input, symbol CA[5:0]_A, CB[5:0]_B. Each channel (A and B) has its own command/address signals.

Command/address on-die-termination control, input, symbol ODT_CA_A, ODT_CA_B. Turns on or off the on-die-termination for the CA pins.

Data Input/Output, I/O, symbol DQ[15:0]_A, DQ[15:0]_B. Bidirectional data bus. Each channel (A and B) has its own bus.

Data Strobe, I/O, symbol DQS[1:0]_t_A, DQS[1:0]_c_A, DQS[1:0]_t_B, DQS[1:0]_c_B.

Bidirectional differential output clock signals used to strobe data during READ or WRITE. Each channel (A and B) has its own DQS strobes.

Data Mask Inversion, I/O, symbol DMI[1:0]_A, DMI[1:0]_B. Bidirectional signal indicates when data on the data bus is inverted or in normal state, or provides write data masking information to the DRAM, depending on mode register setting for data inversion or data mask. Each channel (A and B) has its own DMI signals.

Calibration Reference, reference, symbol ZQ. Calibrates output drive strength and termination resistance.

Power Supplies, supply, symbol VDDQ, VDD1, VDD2.

Ground Reference, GND, symbol VSS, VSSQ.

Reset, input, symbol RESET_n. Active low reset signal.

Another example DRAM standard that is suitable for embodiments of the DRAM 1102 is the JEDEC standard number 79-4, for DDR4 (double data rate version 4) DRAM, summarized below. Similarly or identically named pins or signals in LPDDR4 and DDR4 standards perform similar or identical functions. Additional information is available under the published standard.

Clock, input, symbol CK_t, CK_c. Differential clock inputs.

Clock Enable, input, symbol CKE, (CKE1). Activates and deactivates internal clock signals, device input buffers and output drivers.

Chip Select, input, symbol CS_n, (CS1_n).

Chip ID, input, symbol C0, C1, C2. Selects each slice of a stacked component.

On die termination, input, symbol ODT, (ODT1). Applies to selected pins for selected configurations.

Activation Command Input, input, symbol ACT_n). Defines Activation command being entered along with CS_n.

Command Inputs, input, symbol RAS_n/A16, CAS_n/A15, WE_n/A14. Multifunction pins define command being entered.

Input Data Mask and Data Bus Inversion, I/O, symbol DM_n/DBI_n/TDQS_t, (DMU_n/DBIU_n), (DML_n/DBIL_n). Input mask signal, or indicator of true or inverted data.

Bank Group Inputs, input, symbol BG0-BG1. Defines to which bank group Active, Read, Write or Precharge command is applied.

Bank Address Inputs, input, symbol BA0-BA1. Defines to which bank Active, Read, Write or Precharge command is applied.

Address Inputs, input, symbol A0-A17. Provide row address for Activate commands, and column address for Read/Write commands.

Auto-precharge, input, symbol A10/AP. Address A10 is sampled during Read Write commands to determine Auto-precharge.

Burst Chop, input, symbol A12/BC_n. Address A12 is sampled during Read/Write commands to determine Burst Chop.

Active Low Asynchronous Reset, input, symbol RESET_n.

Data Input/Output, I/O, symbol DQ. Bidirectional data bus.

Data Strobe, I/O, symbol DQS_t, DQS_c, DQSU_t, DQSU_c, DQSL_t, DQSL_c. Output read data, input write data.

Termination Data Strobe, output, symbol TDQS_t, TDQS_c. Enables termination resistance function, data mask function or data mask inversion, depending on mode register.

Command and Address Parity Input, input, symbol PAR. Supports Even Parity.

Alert, I/O, symbol ALERT_n. Multifunction alert for CRC error, command and address parity error, connectivity test.

Connectivity Test Mode Enable, input, symbol TEN. Enables connectivity test mode operation.

No Connect, symbol NC.

DQ power supply, supply, symbol VDDQ.

DQ Ground, supply, symbol VSSQ.

Power Supply, supply, symbol VDD.

Ground, supply, symbol VSS.

DRAM activating power supply, supply, symbol VPP.

Reference voltage for CA, supply, symbol VREFCA.

Reference pin for ZQ calibration, supply, symbol ZQ.

Figure 12:
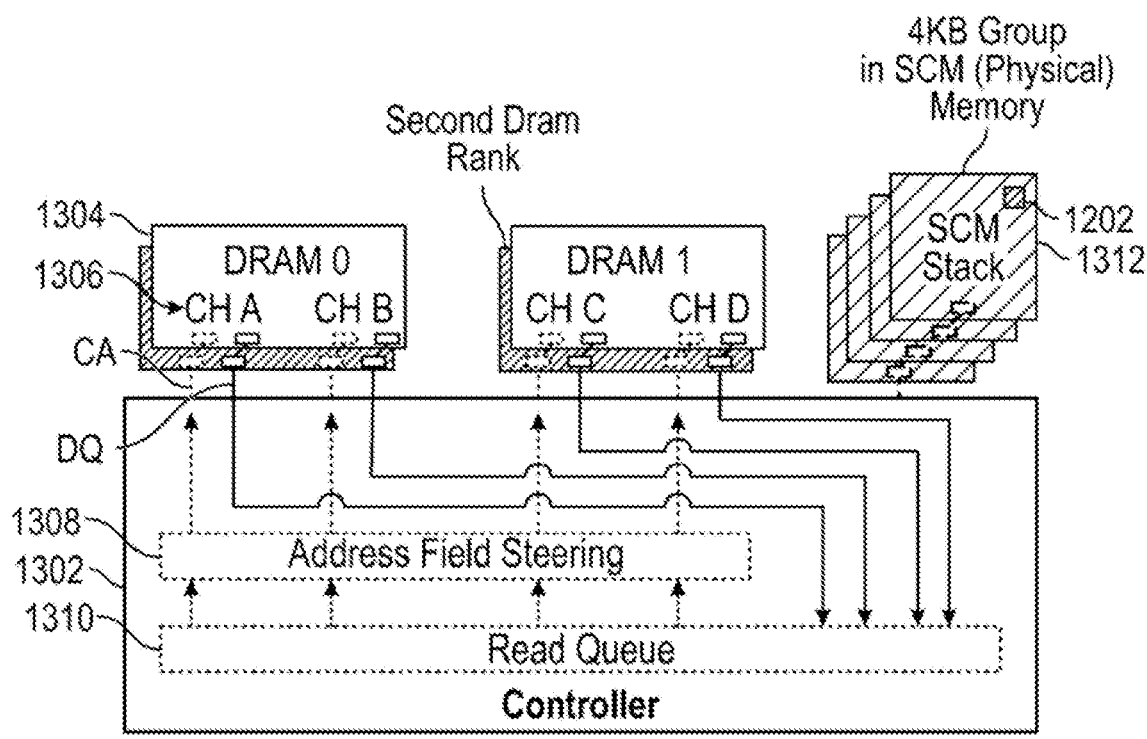
FIG. 12 depicts a controller using a DRAM with cache mode in accordance with present embodiments.

FIG. 12 depicts a controller 1302 using a DRAM 1304 with cache mode in accordance with present embodiments. Presenting a solution to potential limitations of cache memory systems with tag SRAM on controllers, the components in FIG. 12 add tag capacity to the DRAM in a special sub-array (map) group, in various embodiments described with reference to FIGS. 1A-11. In cache mode, the DRAM accesses the tag, and selects the correct data (or indicates miss). Tag and data spaces are interleaved for optimal performance.

In various embodiments, the controller 1302 could be a CPU, a separate system on chip (SoC) distinct from the CPU and memory, or on a module so long as the controller 1302 is in the path of the SCM. Buses that could connect the controller to the DRAM and the controller to the SCM include DDRX, SATA, PCIe and others. The system could work with one DRAM 1304 with one channel, one DRAM 1304 with two channels, two DRAMs 1304 each with one channel, etc., rather than two DRAMs each with two channels as shown in the example in FIG. 12. Also, there could be buffers in the path of the direct connection bus to expand capacity.

In one embodiment, described below as configuration example X-A, a copy of a 4 kB group 1202 in SCM (physical) memory stack 1312, is stored in in DRAM (cache) memory distributed across 32 banks in DRAM for best performance. DRAM 1304 is shown in two DRAM components (which could be ICs, multichip IC packages, logical units, etc.) each with two channels 1306, coupled to the controller 1302. Other configurations also described below can be implemented in the system shown in FIG. 12. The controller 1302 has a read queue 1310 and address field steering 1308, which steers address bits in various formats or schemes, according to configurations. Some embodiments have a single configuration, and some embodiments have multiple configurations. In some embodiments, the physical address fields are placed in CA packets for the DRAM. A control register field selects the cache configuration used. Address field steering 1308 uses logic, multiplexing or other circuitry, or software or firmware executing on a processor, or combinations thereof as readily devised in accordance with the teachings herein.

With the system in cache mode, cache read logic of the controller 1302 sends a cache read command (see FIGS. 15A-17) across a memory bus to the DRAM 1304. Cache results logic receives a response from the DRAM 1304 SCM 1312 with the cached data, or an indication of a miss resulting from comparing the tag compare field with the tag field stored in the DRAM 1304. In the case of a miss, cache fetch logic sends a cache fetch command across another memory bus to SCM 1312 (shown as SCM stack). The cache fetch command causes the SCM 1312 to send the data associated with the tag field to the controller 1302. Cache fetch logic writes the data that it receives from the SCM 1312, in response to the cache fetch command, into the DRAM 1304 as cached data. In some embodiments, cache read logic retries the cache read command to the DRAM 1304.

Figure 13A:
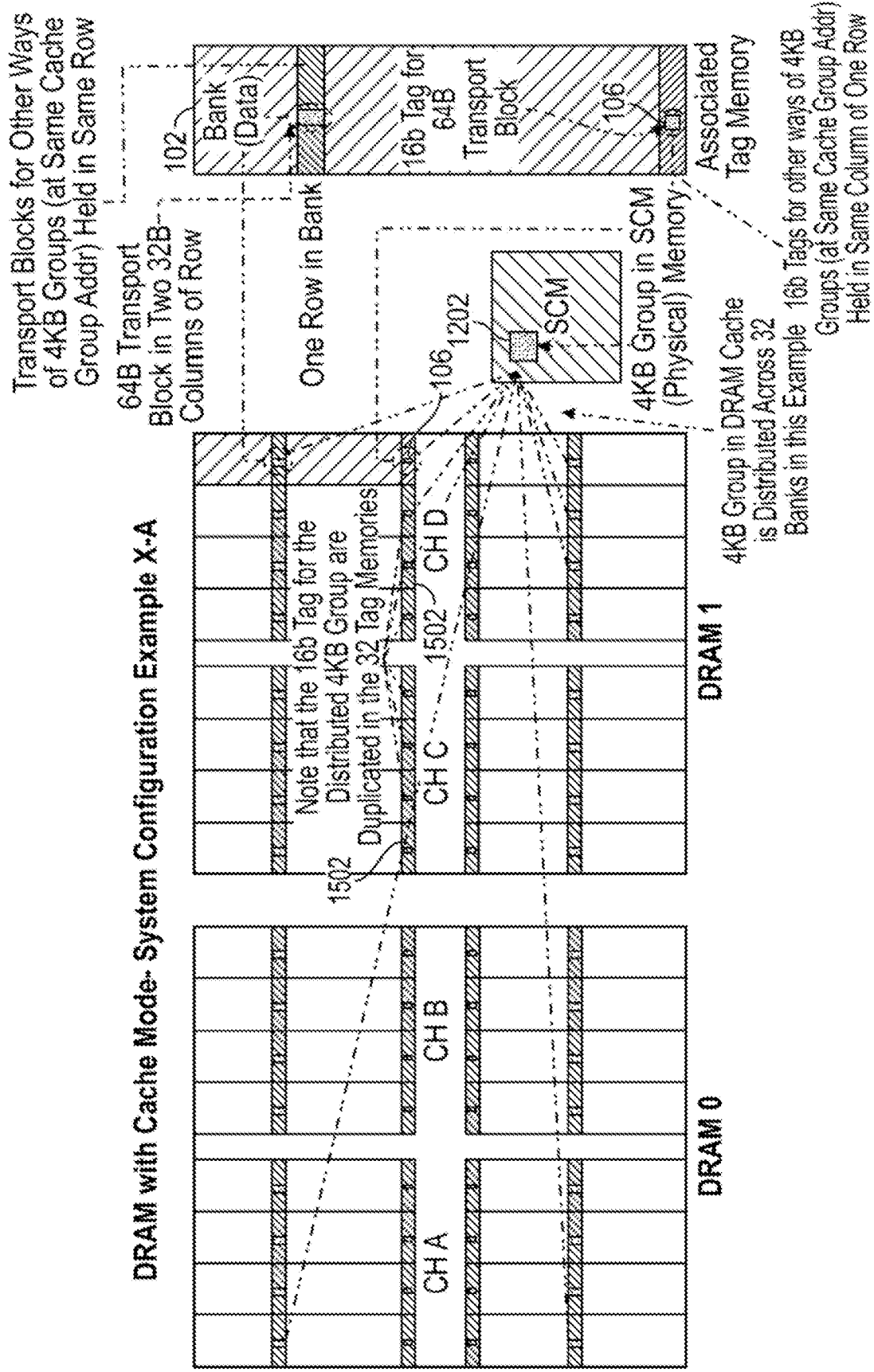
FIG. 13A depicts system configuration example X-A, in which the data ways are held within multiple banks of multiple devices, and there is overlapped tag/data access.
Figure 13B:
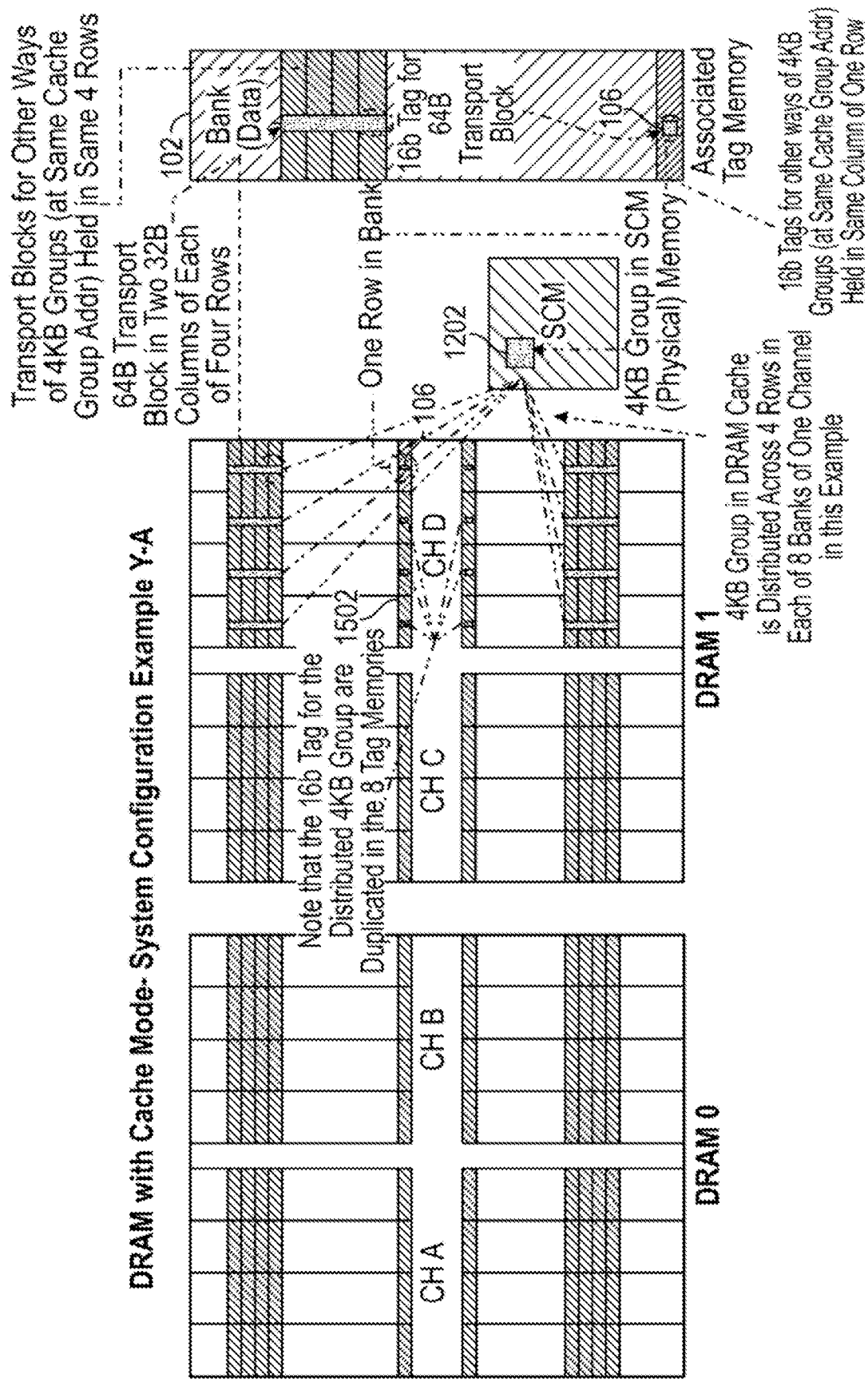
FIG. 13B depicts system configuration example Y-A, in which the data ways are held within multiple banks of a single device, and there is overlapped tag/data access.
Figure 13C:
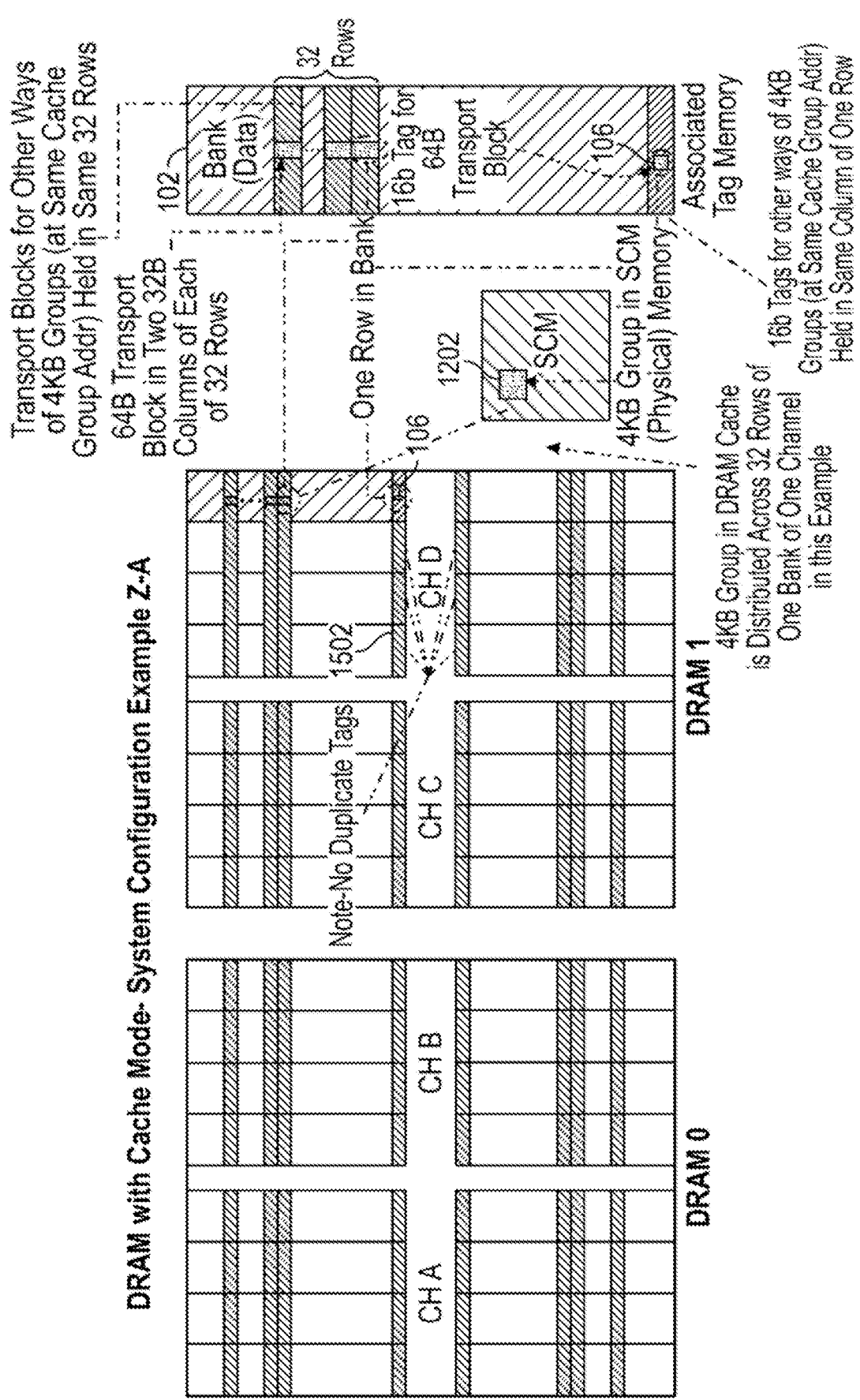
FIG. 13C depicts system configuration example Z-A, in which the data ways are held within a single bank, and there is overlapped tag/data access.

Below is a table comparing system configurations of a DRAM with cache mode. For the various configurations X-A, Y-A, Z-A, Z-B, "A"=overlapped tag/data access, and "B"=non-overlapped tag/data access. By overlapped, it is meant that the data access overlaps the tag access, in other words the data access is begun before the tag access is complete. By non-overlapped, it is meant that the data access does not overlap the tag access, in other words the data access is begun after the tag access is complete. Non-overlapped tag/data access takes longer than overlapped tag/data access. "Z"=data "ways" held within a single bank, "Y"=data "ways" held within multiple banks of a single device, and "X"=data "ways" held within multiple banks of multiple devices. Configuration X-A, with data ways held within multiple banks of multiple devices and overlapped tag/data access is depicted in FIG. 13A. Configuration Y-A, with data ways held within multiple banks of multiple devices and overlapped tag/data access is depicted in FIG. 13B. Configuration Z-A, with data ways held within a single bank and overlapped tag/data access is depicted in FIG. 13C. Configuration Z-B, with data ways held within a single bank and non-overlapped tag/data access is depicted in 13D. Tags are held in associated tag banks with the same XYZ distribution option as the data in the databanks. That is, in configuration X, the data ways and the associated tag banks are held within multiple banks of multiple devices. In configuration Y, the data ways and the associated tag banks are held within multiple banks of a single device. In configuration Z, the data ways and the associated tag banks are held within a single bank.

| configuration[2] | X-A | Y-A | Z-A | Z-B |
|---|---|---|---|---|
| metrics | | | | |
| tag/data row access | overlapped (A) | overlapped (A) | overlapped (A) | non-overlapped (B) |
| 4 kB group distribution | 32 banks (X) | 8 banks (Y) | 1 bank (Z) | 1 bank (Z) |
| tag overhead (16 bits per tag) | 1.6% | 0.40% | 0.05% | 0.05% |
| hit access time[1] | $t_{CA} + t_{RCD} + t_{MATCH} + t_{COL} + t_{DQ}$~2 ns + 18 ns + 10 ns + 8 ns + 8 ns~46 ns | $t_{CA} + t_{RCD} + t_{MATCH} + t_{COL} + t_{DQ}$~2 ns + 18 ns + 10 ns + 8 ns + 8 ns~46 ns | $t_{CA} + t_{RCD} + t_{MATCH} + t_{COL} + t_{DQ}$~2 ns + 18 ns + 10 ns + 8 ns + 8 ns~46 ns | $t_{CA} + t_{RCD} + t_{MATCH} + t_{COL} + t_{DQ}$~2 ns + 18 ns + 10 ns + 18 ns + 8 ns + 8 ns~64 ns |
| energy/bit for 64 byte hit access | ~1× | ~1× | ~1× | ~1× |
| bandwidth to access 4 kB group (after miss) | ~3.2× ($t_{FAW}$ limited) | ~0.8× ($t_{FAW}$ limited) | ~0.4× ($t_{RC}$ limited) | ~1× |

-continued

| configuration[2] | X-A | Y-A | Z-A | Z-B |
|---|---|---|---|---|
| energy/bit to access 4 kB group (after miss) | ~0.85× (1/2 $E_{ROW}$) | ~0.85× (1/2 $E_{ROW}$) | ~0.85× (1/2 $E_{ROW}$) | ~0.7× (1/32 $E_{ROW}$) |

[1]legacy (non-cache) access time $t_{CA} + t_{RCB} + t_{COL} + t_{DQ}$~2 ns + 18 ns + 8 ns + 8 ns~36 ns
[2]configuration assumptions
8 GB/DRAM
32 bytes/column
64 column/row (2 kB row)
16K rows/bank
8 banks/channel
2 channels per DRAM
$t_{RC}$~50 ns
$t_{FAW}$~40 ns
4 Gb/second DQ bit rate
16 ways (sets)/DRAM cache line[3]
4 kB/DRAM cache line (group)
[3]note-16 ways is chosen so that the 16 × 16b tags for a group address in the cache fits in one column access; if more ways are needed, then more than one column access is needed to access and check all the tags The above comparison and following details are for one particular embodiment, but in any given implementation specifications like access time may differ. A legacy (non-cache) access time is about 36 ns. The configuration assumptions include two channels per DRAM, 8 GB per DRAM, 32 bytes per column, 64 columns per row (2 kB rows), 16 K rows per bank, eight banks per channel, $t_{RC}$ about 50 ns, $t_{FAW}$ about 40 ns, 4 Gb per second DQ bit rate, 16 ways (sets) per DRAM cache line, and 4 kB per DRAM cache line (group). All of the overlapped tag/data access configurations X-A, Y-A, Z-A have hit access time about 46 ns, which is shorter than the hit access time 64 ns for the non-overlapped tag/data access of configuration Z-B. But, the non-overlapped tag/data access of configuration Z-B has the lowest energy per bit cost to access a 4 kB group after a miss, and has a tie with configuration Z-A for the lowest tag overhead at 0.05%. Other characteristics and trade-offs for the various configurations are readily explored in the table.

FIG. 13A depicts system configuration example X-A, in which the data ways are held within multiple banks 102 of multiple devices, and there is overlapped tag/data access. A 4 kB group 1202 in SCM (physical) memory is copied and distributed across 32 banks 102 in this example. The 16 bit tag for the distributed 4 kB group 1202 is duplicated in the 32 tag memories 1502, one per bank 102. 16 bit tags for other ways of 4 kB groups (at the same cache group address) are held in the same column of one row in the bank 102. Transport blocks for other ways of 4 kB groups (at the same cache group address) are held in the same row as the 64 byte transport block, which is held in two 32 byte columns of the row in the bank 102. Configuration X-A may benefit DRAM cache systems using wide data buses across multiple channels.

FIG. 13B depicts system configuration example Y-A, in which the data ways are held within multiple banks 102 of a single device, and there is overlapped tag/data access. A 4 kB group 1202 in SCM (physical) memory is copied and distributed across four rows in each of eight banks 102 of one channel (channel D) in this example. The 16 bit tag for the distributed 4 kB group 1202 is duplicated in the eight tag memories 1502 (one in each of the eight banks of one channel, channel D) in this example. 16 bit tags for other ways of 4 kB groups (at the same cache group address) are held in the same column of one row in the bank 102. Transport blocks for other ways of 4 kB groups 1202 (at the same cache group address) are held in the same four rows in the bank 102 as the 64 byte transport block, which is held in two 32 byte columns of each of the four rows in the bank 102. Configuration Y-A may be beneficial for multiple sequential data accesses at successive addresses in a single channel. There may be less average power consumption for multiple sequential data accesses at successive addresses in a single channel than with other configurations.

FIG. 13C depicts system configuration example Z-A, in which the data ways are held within a single bank 102, and there is overlapped tag/data access. A 4 kB group 1202 in SCM (physical) memory is copied and distributed across 32 rows of one bank 102 of one channel in this example. A 16-bit tag 106 for a 64 byte transport block is in associated tag memory 1502 in the bank 102. There are no duplicate tags in other banks 102. 16 bit tags for other ways of 4 kB groups 1202 (at the same cache group address) are held in the same column of one row in the tag memory 1502 in the bank 102. Transport blocks for other ways of 4 kB groups 1202 (at the same cache group address) are held in the same 32 rows as the 64 byte transport block, which is held in two 32 byte columns of each of 32 rows in the bank 102. Configuration Z-A does not require duplicate tags and is thus less consumptive of rows of memory for the tags. Configurations X, Y, and Z correspond to different schemes for addressing rows, columns, banks and channels in the DRAM, and may affect access times and energy consumption.

Figure 13D:
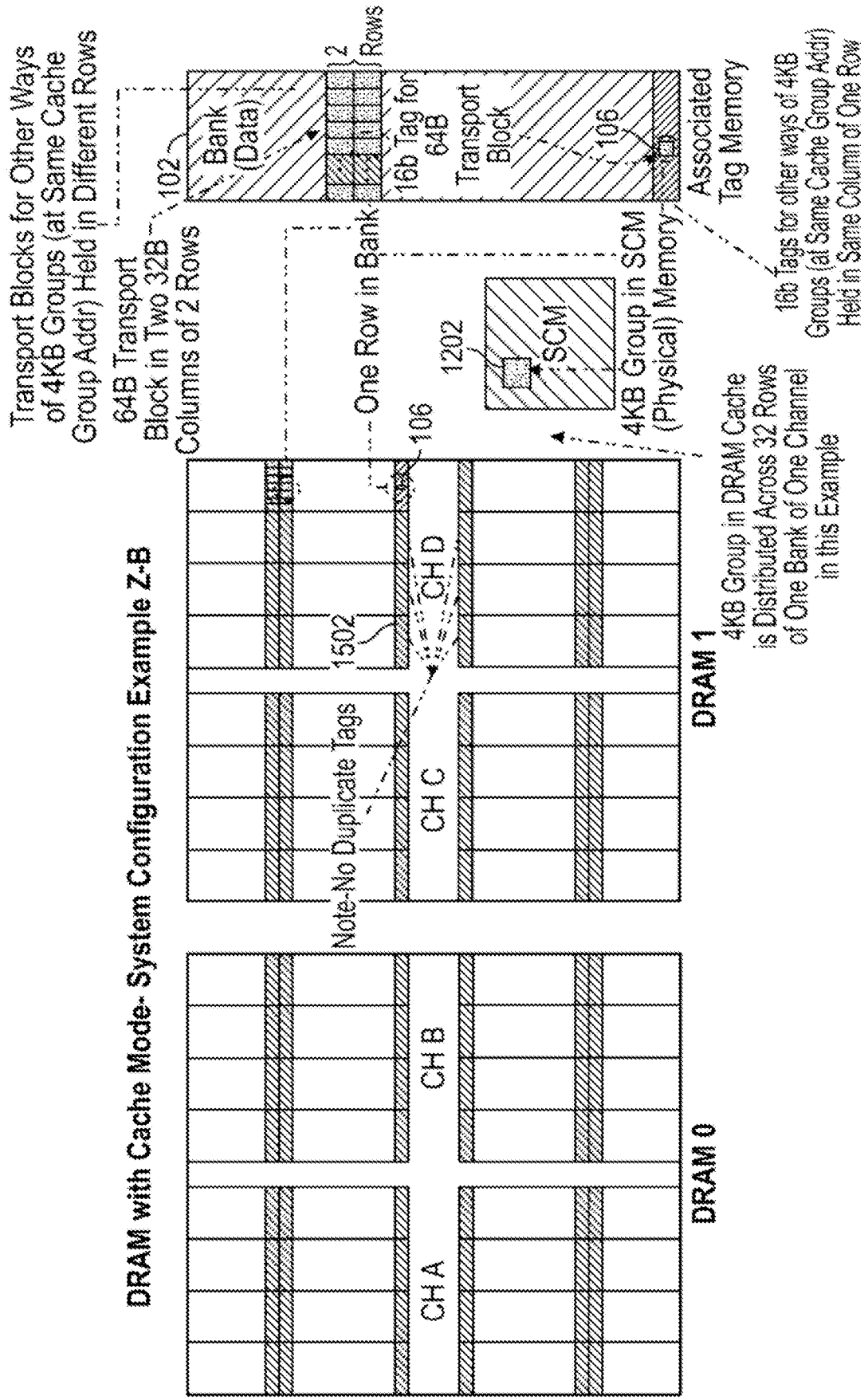
FIG. 13D depicts system configuration example Z-B, in which the data ways are held within a single bank, and there is non-overlapped tag/data access.

FIG. 13D depicts system configuration example Z-B, in which the data ways are held within a single bank 102, and there is non-overlapped tag/data access. A 4 kB group 1202 in SCM (physical) memory is copied and distributed across 32 rows of one bank 102 of one channel in this example. A 16-bit tag 106 for a 64 byte transport block is in associated tag memory 1502 in the bank 102. There are no duplicate tags in other banks 102. 16 bit tags for other ways of 4 kB groups 1202 (at the same cache group address) are held in the same column of one row in the tag memory 1502 in the bank 102. Transport blocks for other ways of 4 kB groups 1202 (at the same cache group address) are held in different rows in the bank 102. The 64 byte transport block is held in two 32 byte columns in two rows in the bank 102. Configuration Z-B does not require duplicate tags and is thus less consumptive of rows of memory for the tags. Configuration B has longer access time than configuration A, but may have lower energy consumption.

Figure 14A:
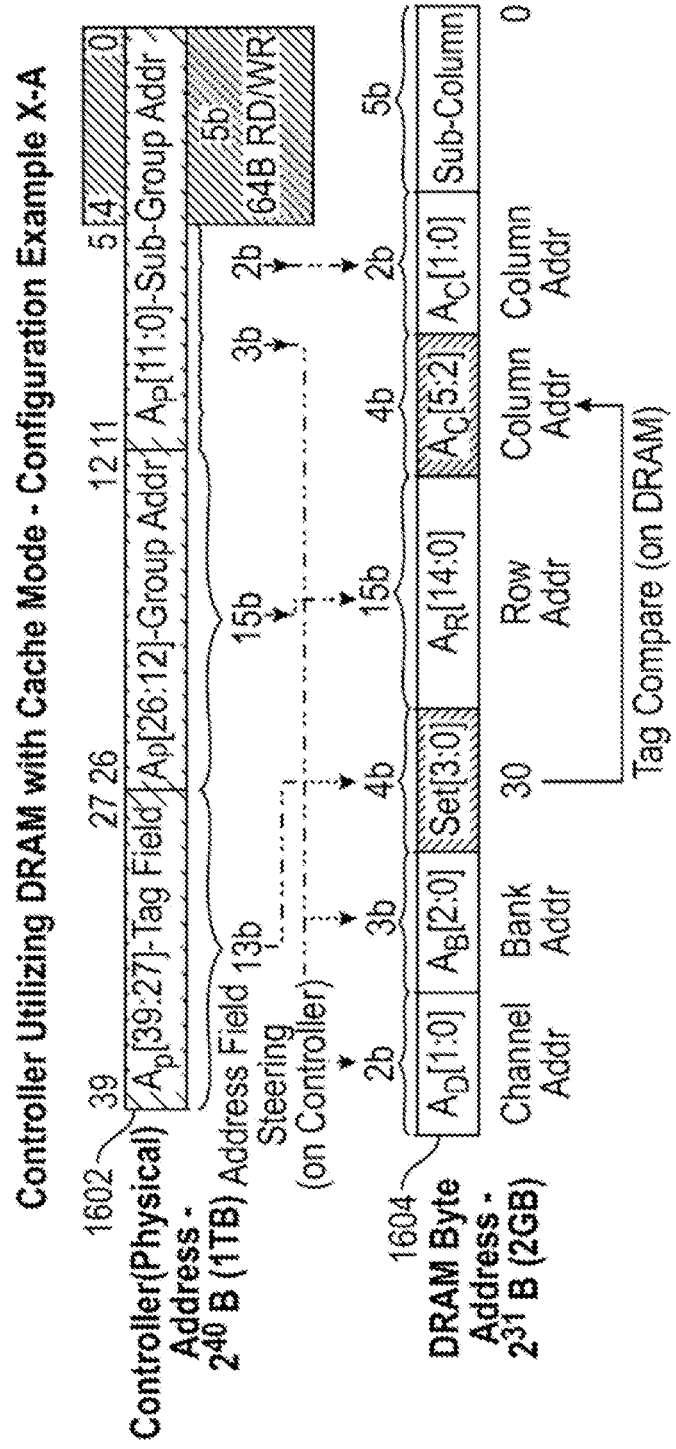
FIG. 14A depicts address field steering in the controller of FIG. 12 for system configuration example X-A as shown in FIG. 13A.

FIG. 14A depicts address field steering 1308 in the controller 1302 of FIG. 12 for system configuration example X-A as shown in FIG. 13A. The DRAM byte address 1604, for 2 GB of DRAM, is derived from the controller (physical) address 1602 for 1 TB memory (e.g., SCM, for which various groups 1202 are cached in the DRAM), through address field steering 1308 on the controller 1302 and tag compare on the DRAM. From the tag field, $A_P[39:27]$, of the controller (physical) address 1602, the DRAM produces the set bits Set[3:0] through tag compare, which are used for four column address bits $A_C[5:2]$ of the DRAM byte address 1604. All 15 bits of the group address, $A_P[26:12]$, of the controller (physical) address 1602, are used for the row address bits $A_R[14:0]$ of the DRAM byte address 1604. The controller 1302 derives the channel address bits $A_D[1:0]$, and the bank address bits $A_B[2:0]$, of the DRAM byte address 1604 from the upper two bits and next three bits of the sub-group address of the controller (physical) address 1602. The next lower two bits of the sub-group address of the controller (physical) address 1602 provide the remaining two column address bits $A_C[1:0]$ of the DRAM byte address 1608. And the lowest five bits of the sub-group address of the controller (physical) address 1602 provide the five bits of the sub-column address, for a 64 byte read/write, to complete the DRAM byte address 1604.

Figure 14B:
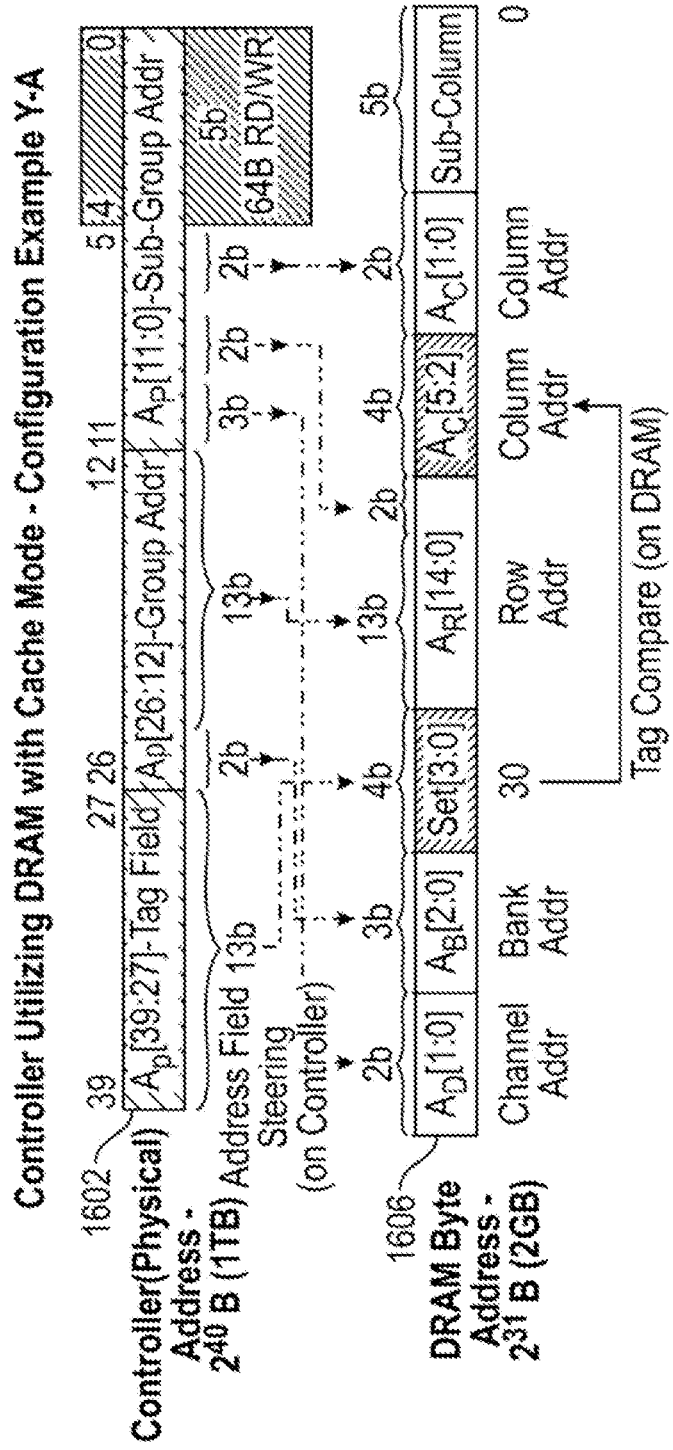
FIG. 14B depicts address field steering in the controller of FIG. 12 for system configuration example Y-A as shown in FIG. 13B.

FIG. 14B depicts address field steering 1308 in the controller 1302 of FIG. 12 for system configuration example Y-A as shown in FIG. 13B. The DRAM byte address 1606, for 2 GB of DRAM, is derived from the controller (physical) address 1602 for 1 TB memory (e.g., SCM, for which various groups 1202 are cached in the DRAM), through address field steering 1308 on the controller 1302 and tag compare on the DRAM. From the tag field, $A_P[39:27]$, of the controller (physical) address 1602, the DRAM produces the set bits Set[3:0] through tag compare, which are used for four column address bits $A_C[5:2]$ of the DRAM byte address 1606. From the upper two bits of the group address, Ap[26:25], of the controller (physical) address 1602, the controller 1302 provides the channel address bits $A_D[1:0]$. From the lower or remaining 13 bits of the group address, Ap[24:12], of the controller (physical) address 1602, the controller 1302 provides the upper 13 bits of the row address, $A_R[14:2]$ for the DRAM byte address 1606. The upper three bits of the sub-group address, $A_P[11:9]$, of the controller (physical) address 1602 are steered as the bank address bits $A_B[2:0]$ of the DRAM byte address 1606. The next lower two bits of the sub-group address, $A_P[8:7]$, of the controller (physical) address 1602, provide the lowest two bits of the row address, $A_R[1:0]$, of the DRAM byte address 1606. The next lower two bits of the sub-group address, Ap[6:5], of the controller (physical) address 1602 are used as the lowest two bits of the column address, $A_C[1:0]$, in the DRAM byte address 1606. And the lowest five bits of the sub-group address of the controller (physical) address 1602 provide the five bits of the sub-column address, for a 64 byte read/write, to complete the DRAM byte address 1606.

Figure 14C:
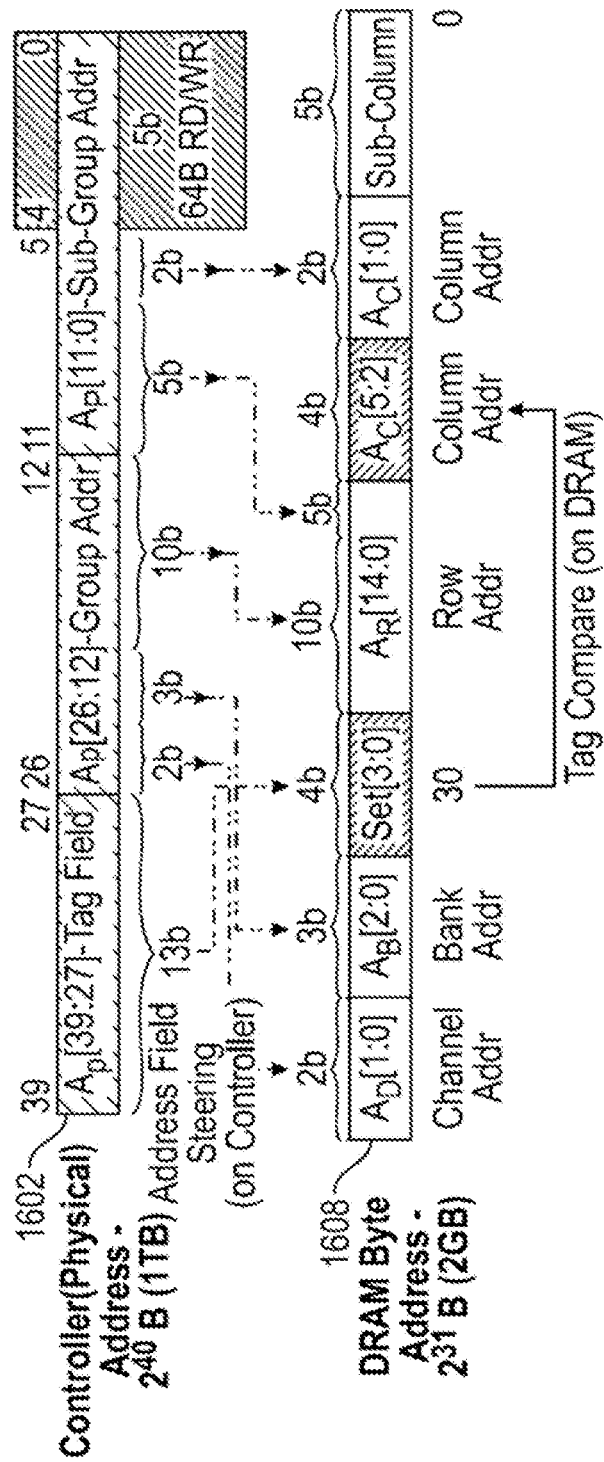
FIG. 14C depicts address field steering in the controller of FIG. 12 for system configuration example Z-A as shown in FIG. 13C.

FIG. 14C depicts address field steering 1308 in the controller 1302 of FIG. 12 for system configuration example Z-A as shown in FIG. 13C. Solid line arrows in FIG. 14C depict the tag compare process on the DRAM. The tag field, which is part of the physical address, is compared to the stored tags in the DRAM, and if there is a match, one of the 16 sets is selected (the Set[3:0] field)—the Set field forms part of the DRAM address that is used to select the data. The DRAM byte address 1608, for 2 GB of DRAM, is derived from the controller (physical) address 1602 for 1 TB of memory (e.g., SCM, for which various groups 1202 are cached in the DRAM), through address field steering 1308 on the controller 1302 and tag compare on the DRAM. From the tag field, $A_P[39:27]$, of the controller (physical) address 1602, the DRAM produces the set bits Set[3:0] through tag compare, which are used for four column address bits $A_C[5:2]$ of the DRAM byte address 1608. That is, the set bits, from tag compare, are used for four column address bits to fetch the cached data. From the group address, $A_P[26:12]$, of the controller (physical) address 1602, the controller 1302 derives the channel address bits $A_D[1:0]$, the bank address bits $A_B[2:0]$, and the upper 10 row address bits $A_R[14:5]$ of the DRAM byte address 1608. Five more row address bits $A_R[4:0]$ of DRAM byte address 1608 are derived from the upper five bits of the sub-group address AP[11:0] of the controller (physical) address 1602. The middle two bits of the sub-group address of the controller (physical) address 1602 provide two more column address bits $A_C[1:0]$ of the DRAM byte address 1608. The lower five bits of the sub-group address of the controller (physical) address 1602 provide the five bits sub-column address of the DRAM byte address 1608.

Figure 14D:
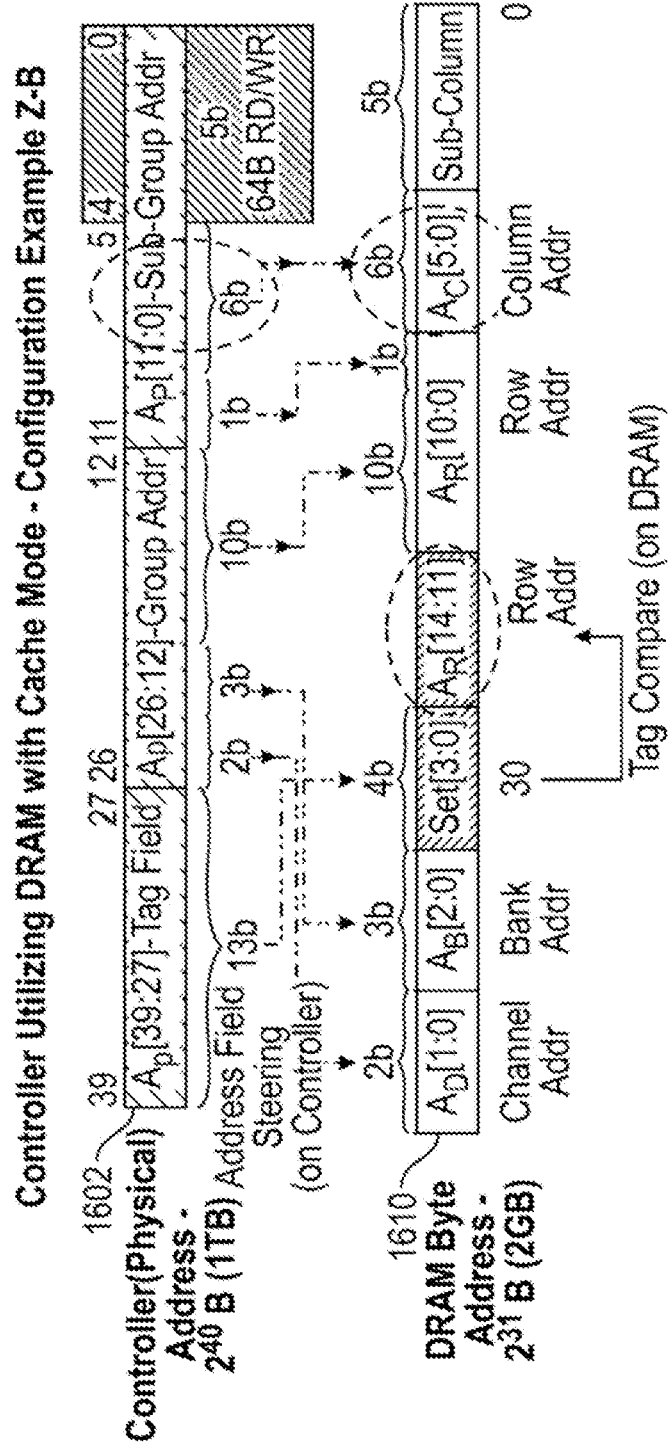
FIG. 14D depicts address field steering in the controller of FIG. 12 for system configuration example Z-B as shown in FIG. 13D.

FIG. 14D depicts address field steering 1308 in the controller 1302 of FIG. 12 for system configuration example Z-B as shown in FIG. 13D. The DRAM byte address 1610, for 2 GB of DRAM, is derived from the controller (physical) address 1602 for 1 TB of memory (e.g., SCM, for which various groups 1202 are cached in the DRAM), through address field steering 1308 on the controller 1302 and tag compare on the DRAM. From the tag field, $A_P[39:27]$, of the controller (physical) address 1602, the DRAM produces the set bits Set[3:0] through tag compare, which are used for the upper four row address bits $A_R[14:11]$ of the DRAM byte address 1608. From the group address, $A_P[26:12]$, of the controller (physical) address 1602, the controller 1302 derives the channel address bits $A_D[1:0]$, the bank address bits $A_B[2:0]$, and the next lower 10 row address bits, $A_R[10:1]$, of the DRAM byte address 1608. The lowest row address bit, $A_R[0]$, of DRAM byte address 1608 is from the uppermost bit of the sub-group address, $A_P[11]$, of the controller (physical) address 1602. The next lower six bits of the sub-group address, $A_P[10:5]$, of the controller (physical) address 1602 provide the six column address bits $A_C[5:0]$ of the DRAM byte address 1608. The lower five bits of the sub-group address of the controller (physical) address 1602 provide the five bits sub-column address of the DRAM byte address 1608.

Figure 15A:
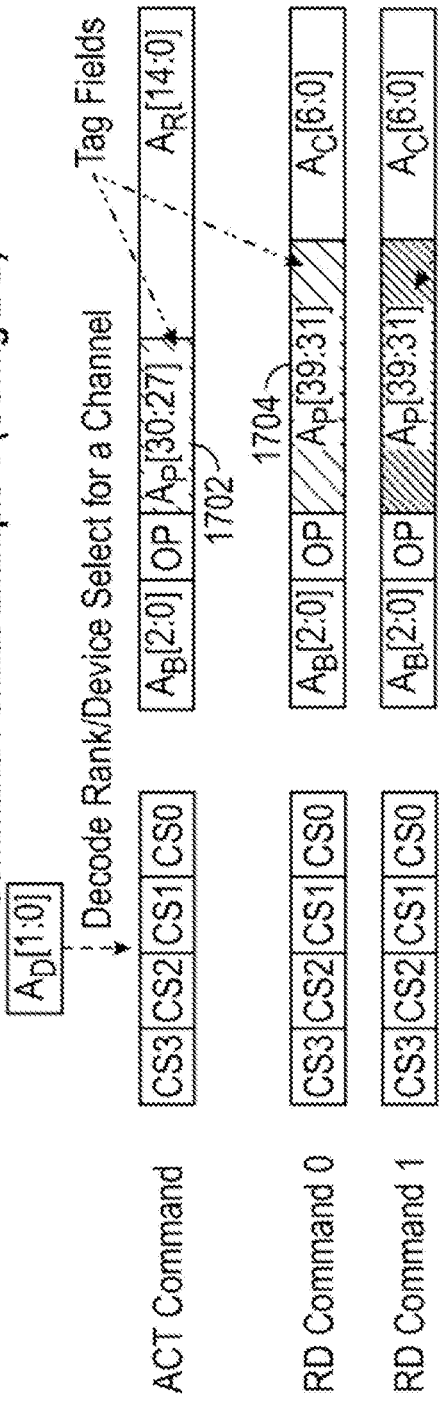
FIG. 15A depicts command format for system configuration example Z-B as shown in FIG. 13D.

FIG. 15A depicts command format for system configuration example Z-B as shown in FIG. 13D. The redundancy in FIG. 15A and FIG. 15B occurs because there are two column access per row access—other DRAM components or subsystems might set this ratio to one column access per row access, and there would not be a redundant field in the command sequence. An ACT command is followed by RD command 0 and RD command 1. In this example, the ACT command indicates it has the least significant tag field 1702 bits, $A_P[30:27]$. The first read command, RD command 0, has the most significant tag field 1704 bits, $A_P[39:31]$. The tag field is not needed in subsequent RD commands in the same row for the same group, e.g., RD command 1. This is because the read command, which has two parts per protocol, has already specified in RD command 0 the tag bits needed to complete the tag field when combined with the tag field 1702 from the ACT command, so the tag field in RD command 1 is redundant.

Figure 15B:
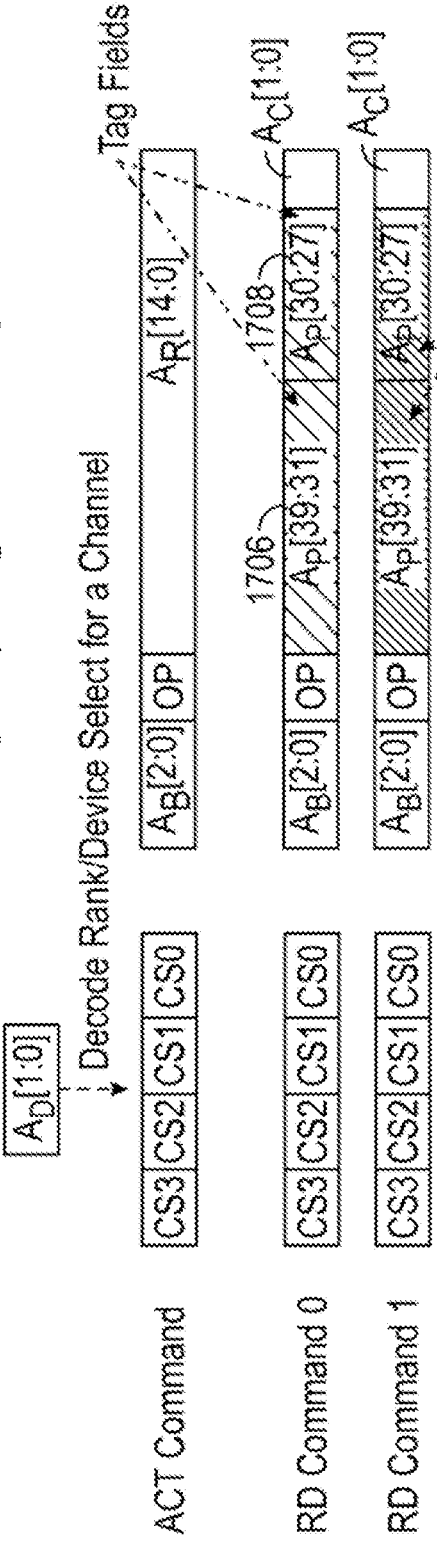
FIG. 15B depicts command format for system configuration examples Z-A, Y-A and X-A as shown in FIGS. 13C, 13B and 13A.

FIG. 15B depicts command format for system configuration examples Z-A, Y-A and X-A as shown in FIGS. 13C, 13B and 13A. An ACT command is followed by a RD command 0 and RD command 1. In this example, the ACT command has only the row address. The first read command, RD command 0, has the most significant tag field 1706 bits $A_P[39:31]$ and least significant tag field 1708 bits $A_P[30:27]$. The tag field is not needed in subsequent RD commands in the same row for the same group, e.g., RD command 1. This is because the read command, which has two parts per protocol, has already specified in RD command 0 all of the tag bits needed to complete the tag field, so the tag field in RD command 1 is redundant.

Figure 15C:
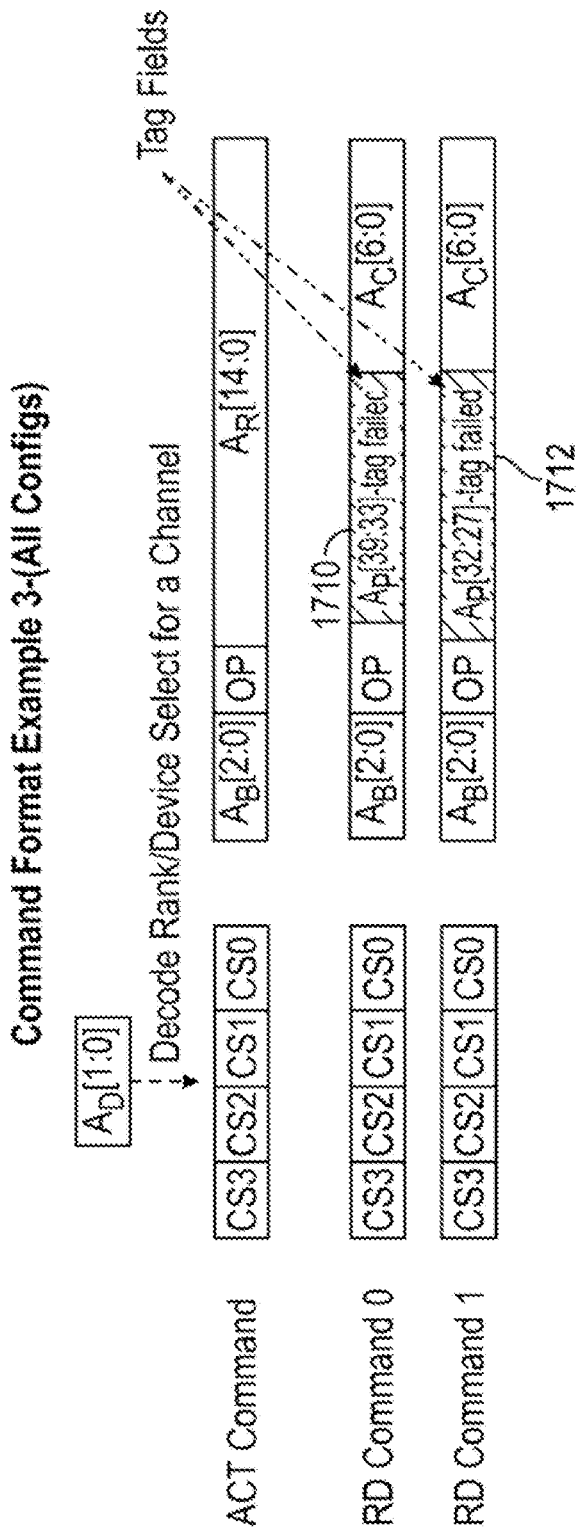
FIG. 15C depicts command format for system configuration examples Z-B, Z-A, Y-A and X-A as shown in FIGS. 13D, 13C, 13B and 13A.

FIG. 15C depicts command format for system configuration examples Z-B, Z-A, Y-A and X-A as shown in FIGS. 13D, 13C, 13B and 13A. An ACT command is followed by a RD command 0 and RD command 1. In this example, the first read command, RD command 0, indicates it has the most significant tag field 1710 bits $A_P[39:33]$. The next read command, RD command 1, has the least significant tag field 1712 bits $A_P[32:27]$. If only a 32 byte access is needed, then the same column can be read twice. Unlike the command format examples in FIGS. 15A and 15B, the RD command 1 does need to provide the remaining tag bits to complete the tag field and so does not have a redundant tag field. With reference to FIGS. 15A-15C, the concept of a "shared" tag field can refer to the fact that the tag field (from the physical address) is split across a row command and a column command (in FIG. 15A), or is specified by one column command and used later by a second column command (in FIG. 15B), or is split across a two successive column commands (in FIG. 15C)—any of these alternatives allow the number of CA pins to be minimized.

Figure 16:
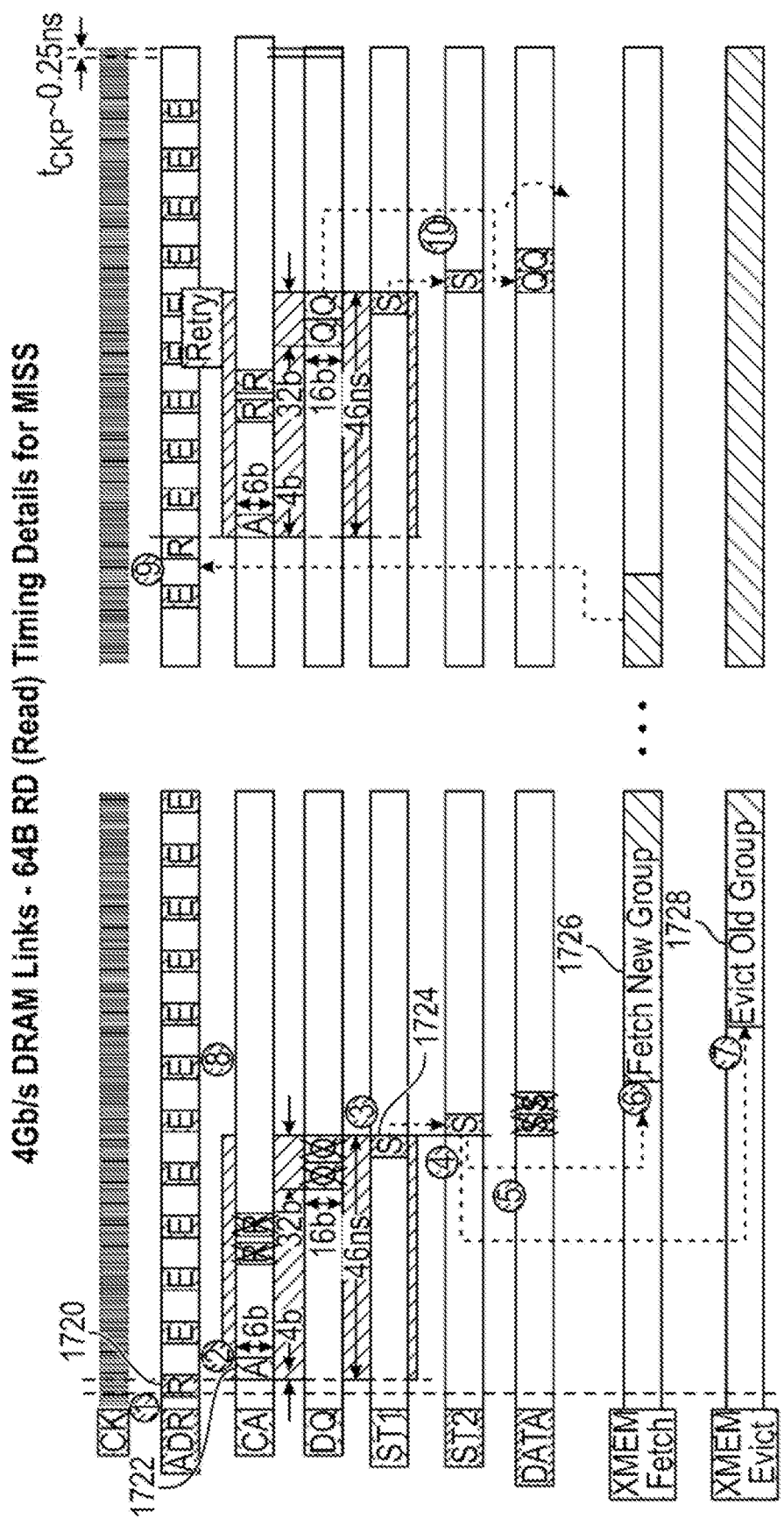
FIG. 16 depicts a read timing detail for a cache miss, with fetch and evict, in a DRAM with cache mode.

FIG. 16 depicts a read timing detail for a cache miss, with fetch and evict, in a DRAM with cache mode. The controller queue receives the next read (RD) transaction (T) 1720, at (1). This is shown as a read address on the address bus (ADR). The ACT/RD access 1722 to DRAM is performed, at (2). The access is canceled by the tag MISS 1724, at (3). This is signaled with the status (ST) signals from the DRAM to the controller. Transaction (T) status is retry, which the system accomplishes by sending status to the execution unit via ST2 signals, at (4). The transaction (T) is moved to the retry buffer at (5) until the fetch operation has returned the read (RD) data. The system initiates a concurrent fetch process at (6), to get the group with the missing read (RD) data from external memory (XMEM). The concurrent fetch process is shown as fetch new group 1726. At (7), the memory controller selects a group to remove from cache memory (to make room for the new group), and initiates a concurrent evict process. This is shown as evict old group 1728. At (8), the system continues with concurrent processing of transactions. The fetch access to the 4 kB fetch buffer is finished at (9), and the 4 kB buffer has been moved to DRAM. The fetch completion is signaled to the memory controller in the background field of the status packet at (10), and the original read can be retried.

Figure 17:
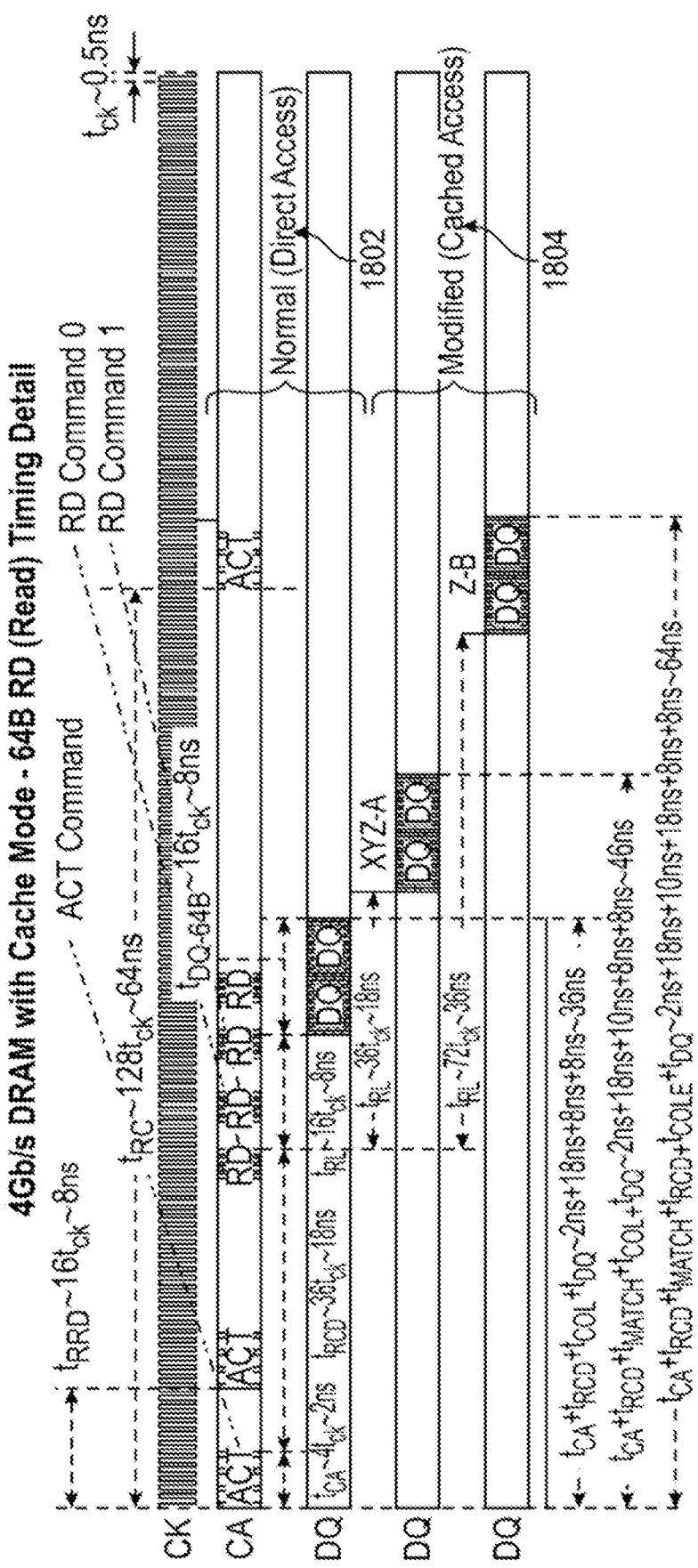
FIG. 17 is a read timing detail for a 64 byte read of a DRAM with cache mode, for a normal (direct) access, and a modified (cached) access.

FIG. 17 is a read timing detail for a 64 byte read of a DRAM with cache mode, for a normal (direct) access 1802, and a modified (cached) access 1804. At a high level (and referring to the table at [00125], the differences between the four configurations affect hit access latency, tag overhead cost, and the bandwidth and energy/bit to access a 4 KB group after a miss (evict/fetch)—these interact in a complicated way, but they cannot be simultaneously optimized— that is why four configurations are needed to illustrate the optimal point for each metric. The CA input packets are in the same position for the modified (cached) access 1804 as for the normal (direct) access 1802. The ACT command, followed by RD command 0 and RD command 1, follow the sequences and have the bits described above with reference to FIGS. 15A-15C, as appropriate to system configuration. Configurations X-A, Y-A and Z-A (see table Comparison of system configuration examples X-A, Y-A, Z-A, Z-B, and FIGS. 13A-13C, 14A-14C and 15B) have overlapped tag and data access, with timing in FIG. 17 shown for configurations XYZ-A as modified (cached access) 1804. Configuration Z-B (see table Comparison of system configuration examples X-A, Y-A, Z-A, Z-B, and FIGS. 13D, 14D and 15A) have non-overlapped tag and data access, with timing in FIG. 17 shown for configuration Z-B as modified (cached) access 1804. This timing can be compared to the faster data read in the normal (direct) access 1802, which is for reading the DRAM directly without cache access.

With reference to FIGS. 16A-16C and 17, in one embodiment there are three commands, the ACT followed by two successive column commands, for two 32 byte read or write data accesses that combine to a 64 byte access. The two successive column commands are a tag column access operation and a subsequent data column access operation. The same tag is used for both column accesses. That is, the tag compare field of the tag column access operation is also used for the tag compare field of the data column access operation.

Figure 18:
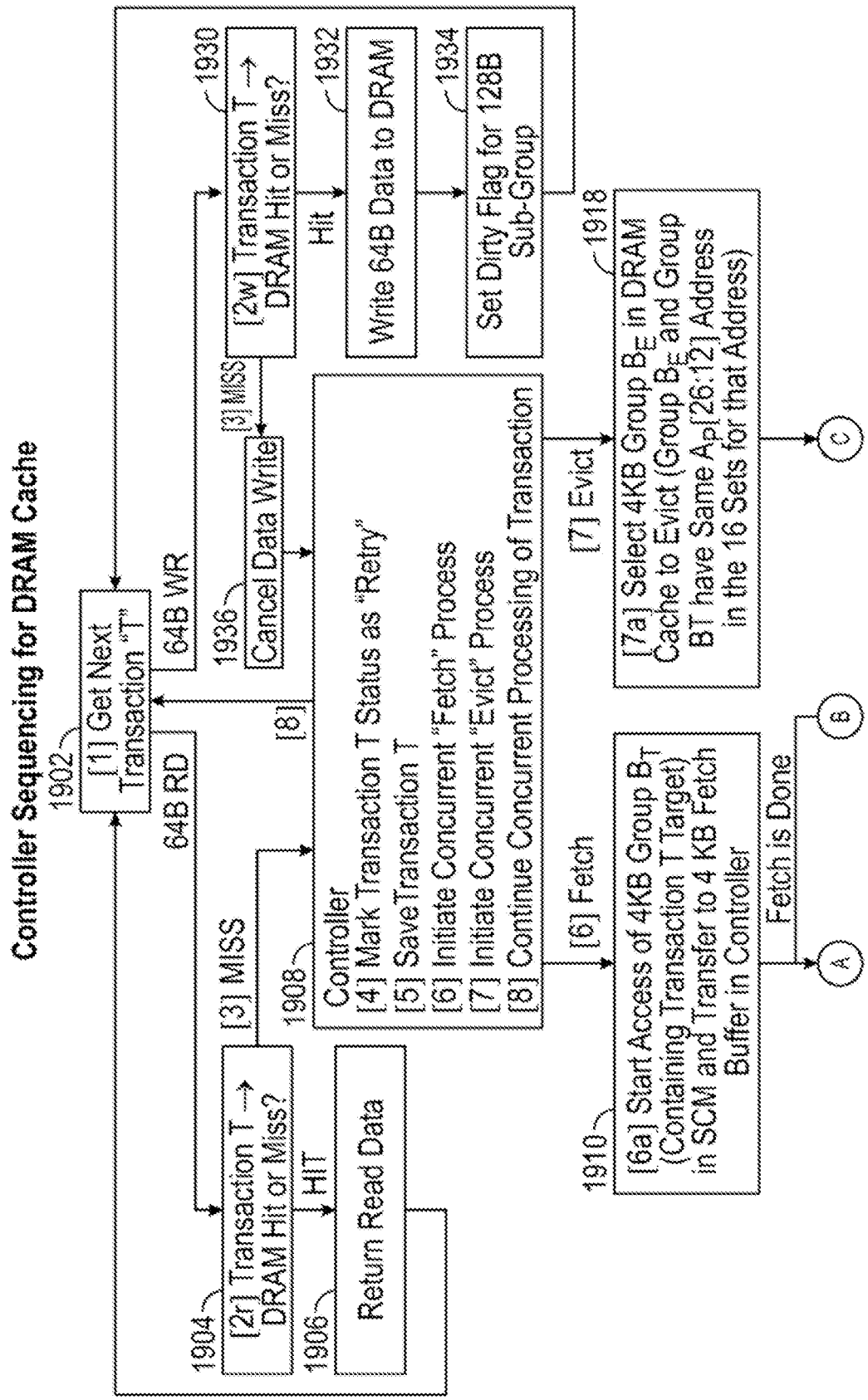
FIG. 18 is a flow diagram depicting controller sequencing for a DRAM cache, experiencing a cache miss.
Figure 18:
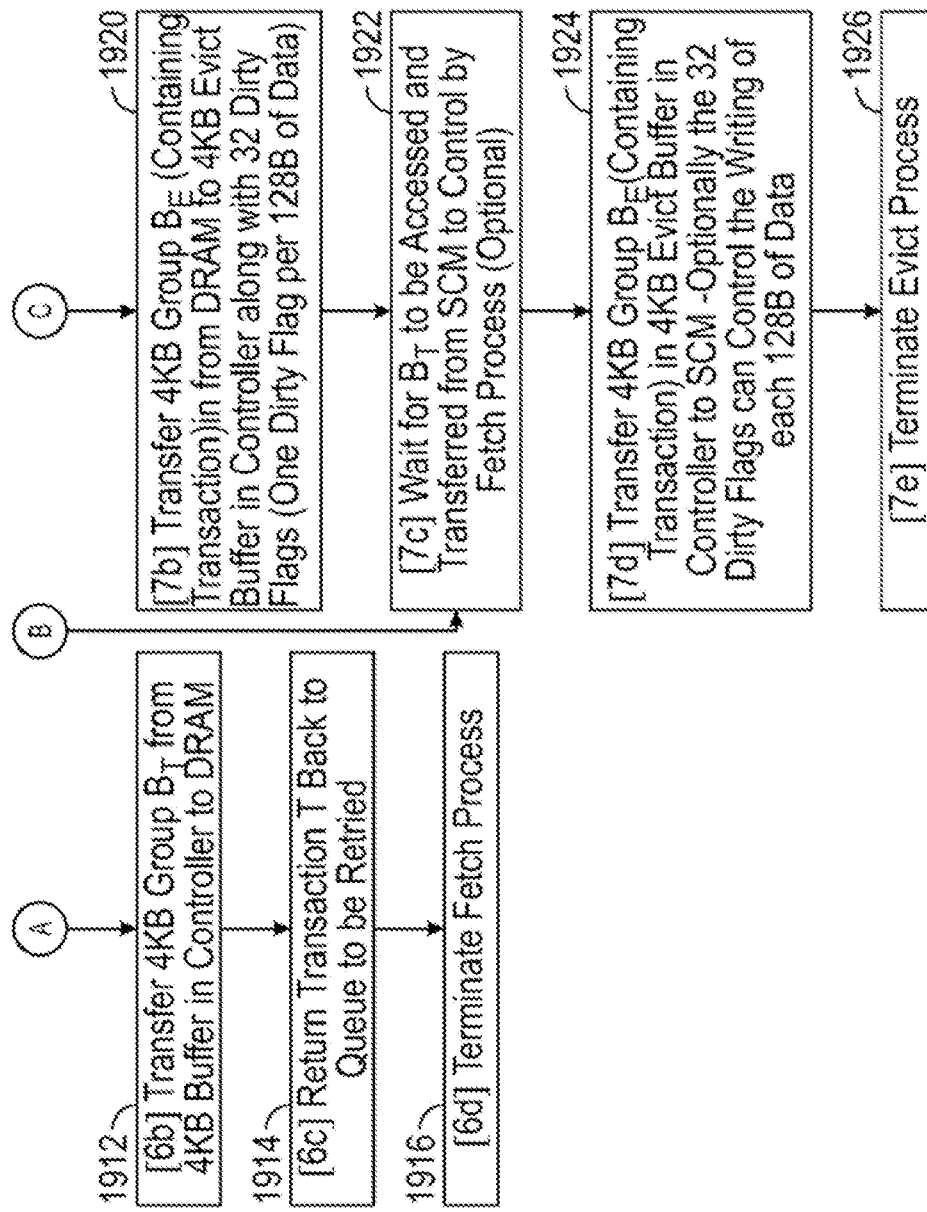

FIG. 18 is a flow diagram depicting controller sequencing for a DRAM cache, experiencing a cache miss. With forward reference to FIG. 19, various system components participate in the actions described in FIG. 18. Starting with an action 1902, [1] get next transaction "T", the transaction could be a read, e.g., 64 byte read (see left side of FIG. 19), or a write, e.g., 64 byte write (see right side of FIG. 18).

For the 64 byte read, flow proceeds to the action 1904, [2r] transaction T to read the DRAM 1304, and determine whether there is a hit or a miss. If a hit, flow proceeds to the action 1906, return read data. If a miss [3], flow proceeds to the actions 1908.

For the 64 byte write, flow proceeds to the action 1930, [2w] transaction T to write to the DRAM, and determine whether there is a hit or a miss. If a hit, flow proceeds to the action 1932, to write 64 byte data to the DRAM 1304 (according to the cache hit), then to the action 1934, set dirty flag for 128 byte sub-group. If a miss [3], flow proceeds to the actions 1908.

For the actions 1908 [8], the controller 1302 performs actions [4] mark transaction T status as "retry", [5] save transaction T, [6] initiate concurrent "fetch" process, [7] initiate concurrent "evict" process, and [8] continue concurrent processing of transactions.

For the [6] fetch, flow proceeds to the action 1910, [6a] start access of 4 kB group $B_T$ (containing transaction T target) in SCM and transfer to 4 kB fetch buffer 2006 in the controller 1302. Process flow branches in parallel, with fetch is done, to the action 1922 [7c], and continues with action 1912 [6b] transfer 4 kB group $B_T$ from 4 kB buffer in controller 1302 to DRAM 1304. This is followed by action 1914 [6c] return transaction T back to queue to be retried, in the read retry buffers 2022, and action 1916 [6d] terminate fetch process. In some embodiments, once the fetch from SCM into DRAM is completed, the memory controller 1302 has to get the data from the DRAM 1304. The controller could wait for confirmation, or in some versions rely on a predetermined time interval, and then request the data from the DRAM 1304 again with the process of action 1902. In some embodiments, the controller 1302 reads data as the data is moved from SCM to the DRAM cache, thereby preventing the need for a separate DRAM read once the data is in the DRAM cache.

For the [7] evict, flow proceeds to the action 1918, [7a] select 4 kB group $B_E$ in DRAM cache to evict (group $B_E$ and group $B_T$ have the same $A_P[26:12]$ address in the 16 sets for that address). Next, flow proceeds to the action 1920 [7b] transfer 4 kB group $B_E$ (containing transaction) in from DRAM to 4 kB evict buffer 2004 in controller 1302 along with 32 dirty flags (one dirty flag per 128 bytes of data). Flow proceeds to the action 1922 [7c] wait for $B_T$ to be accessed and transferred from SCM to control by fetch process (optional). Flow proceeds to the action 1924 [7d] transfer 4 kB group $B_E$ (containing transaction) in 4 kB evict buffer 2004 in controller 1302 to SCM. Optionally, the 32 dirty flags can control the writing of each 128 bytes of data. In action 1926, [7e] the evict process is terminated.

Evict selection options, for various embodiments, are described below.

[7a.1] eviction selection could be random.

[7a.2] several of the 32 128 byte sub-groups of the 16 target 4 kB groups could be sampled. The number of high dirty flags could be used to indicate how much each 4 kB group has been used. The group with the most usage could be chosen. If SCM endurance is an issue, instead the group with zero high dirty flags could be chosen.

[7a.3] Similar to the above, but the touch flag could be used instead to indicate how much the 4 kB block has been used.

Figure 19:
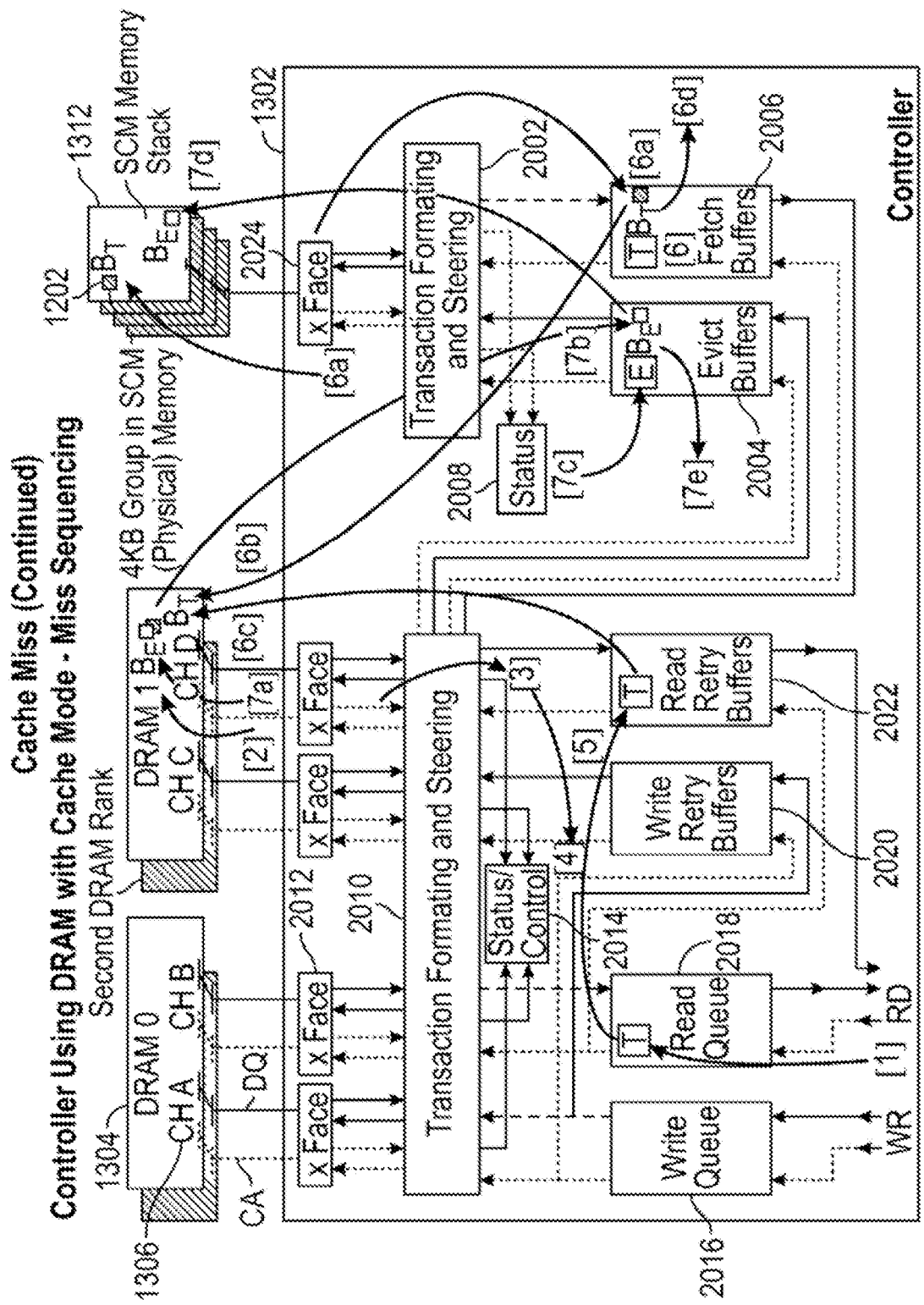
FIG. 19 is a system action diagram depicting the controller using DRAM with cache mode, performing the actions of FIG. 18.

FIG. 19 is a system action diagram depicting the controller using DRAM with cache mode, performing the actions of FIG. 18. In the DRAM system, DRAM 1304 is shown as DRAM 0 and DRAM 1 in first DRAM rank, with more DRAM in a second DRAM rank. Each DRAM 1304 has two channels, channel A and channel B in DRAM 0, channel C and channel D in DRAM 1. SCM memory stack 1312 has a 4 kB group 1202 in SCM (physical) memory. Inside the controller 1302, transaction formatting and steering 2010 is coupled to the DRAM 1304 through interface 2012 (denoted xface). Status/control 2014 is coupled to transaction formatting and steering 2010 for the interfaces 2012 coupled to the DRAM 1304. Transaction formatting and steering 2010 is coupled to a write queue 2016, read queue 2018, write retry buffers 2020 and read retry buffers 2022. Further transaction formatting and steering 2002 is coupled to the SCM memory stack 1312 through a further interface 2024. A further status 2008 is coupled to the transaction formatting and steering 2002. The transaction formatting and steering 2002 is coupled to evict buffers 2004 and fetch buffers 2006, which further couple to the transaction formatting and steering 2014, for the DRAM 1304.

Controller sequencing for the DRAM cache, for a cache miss as described above with reference to FIG. 18, is readily followed in FIG. 19 with use of the bracketed numbers correspondingly present in both FIG. 18 and FIG. 19.

Figure 20:
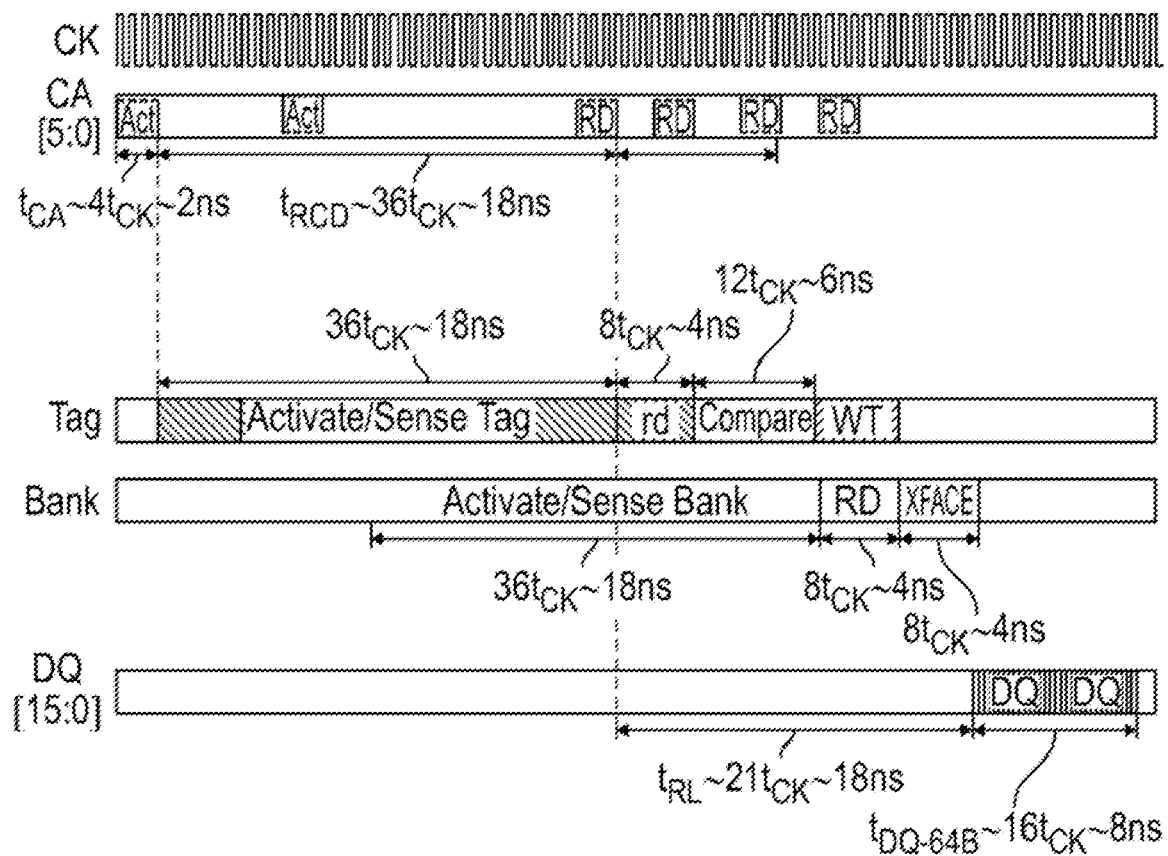
FIG. 20 depicts a touch flag enhancement for the eviction decision process.
Figure 20:
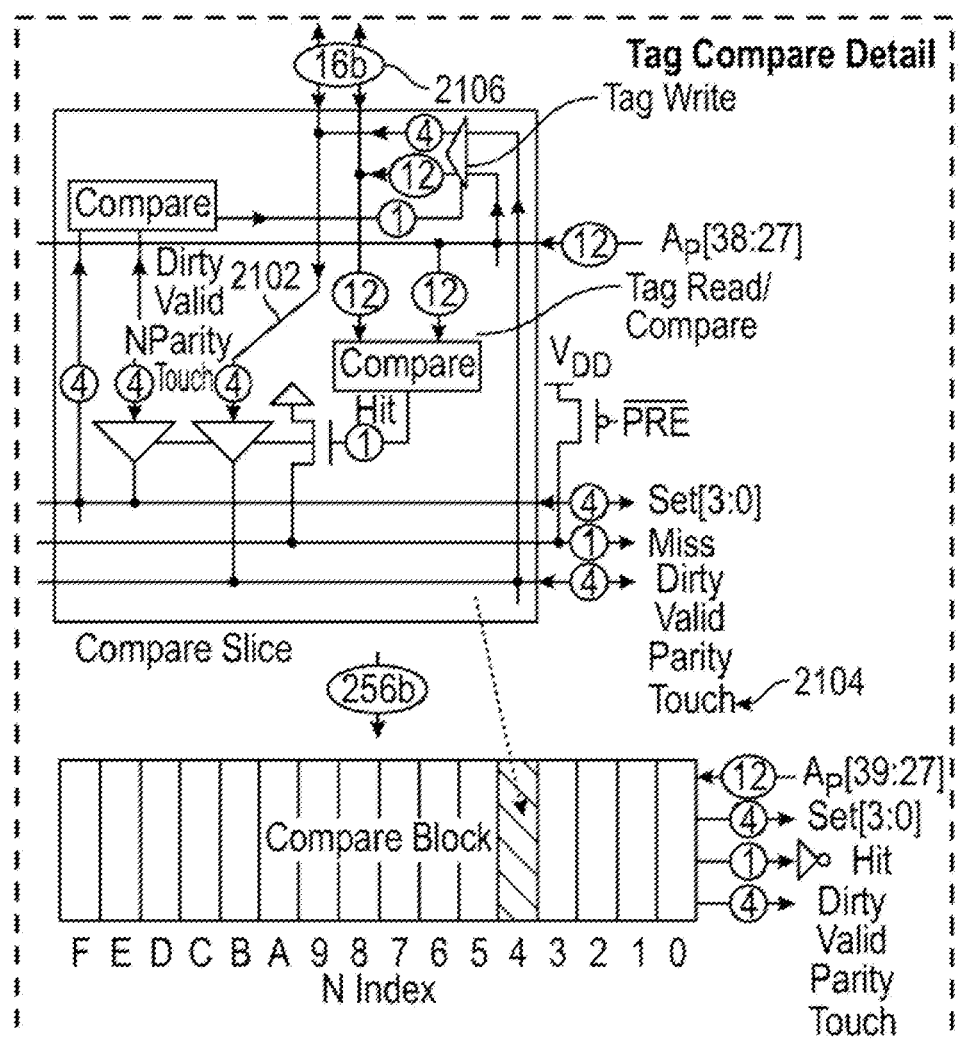

FIG. 20 depicts a touch flag enhancement for the eviction decision process. A touch flag is added to the 16 bit tag flag word 2106, which then has 12 bits for the tag compare and four flag bits, as dirty, valid, parity and touch 2104. Touch 2104 (and dirty) bits are initially low when the 4 kB block is loaded from SCM by the fetch process. A 64 byte read transaction sets the touch 2104 flag high (and adjusts parity) in the local tag flag word 2106 for the 128 byte sub-block that is accessed (similar to when a 64 byte write transaction sets the dirty flag). The touch bit, cleared when the 4 kB block is first written to DRAM cache (i.e., loaded from SCM), is set when the 4 kB block or part of it is read from DRAM cache, to inform the system that the cached 4 kB block is being read and is therefore worth keeping. A 4 kB block that has been written to DRAM cache, so that the touch bit is cleared, but still has the touch bit showing cleared at a later date, may be a candidate for eviction since it is not being read and is therefore not worth keeping. The dirty bit, set by a write transaction, informs the system that cached data has been written to and should therefore be written back to SCM. This is useful in a writeback cache. For the eviction decision process, both the dirty and touch bits have purpose. The touch bit can be used to identify candidates for eviction, as above, and the dirty bit can be used to make sure that the cached data that has been written to (i.e., overwritten) is written back to the SCM, before that location in cache memory can be considered a candidate for eviction.

Figure 21A:
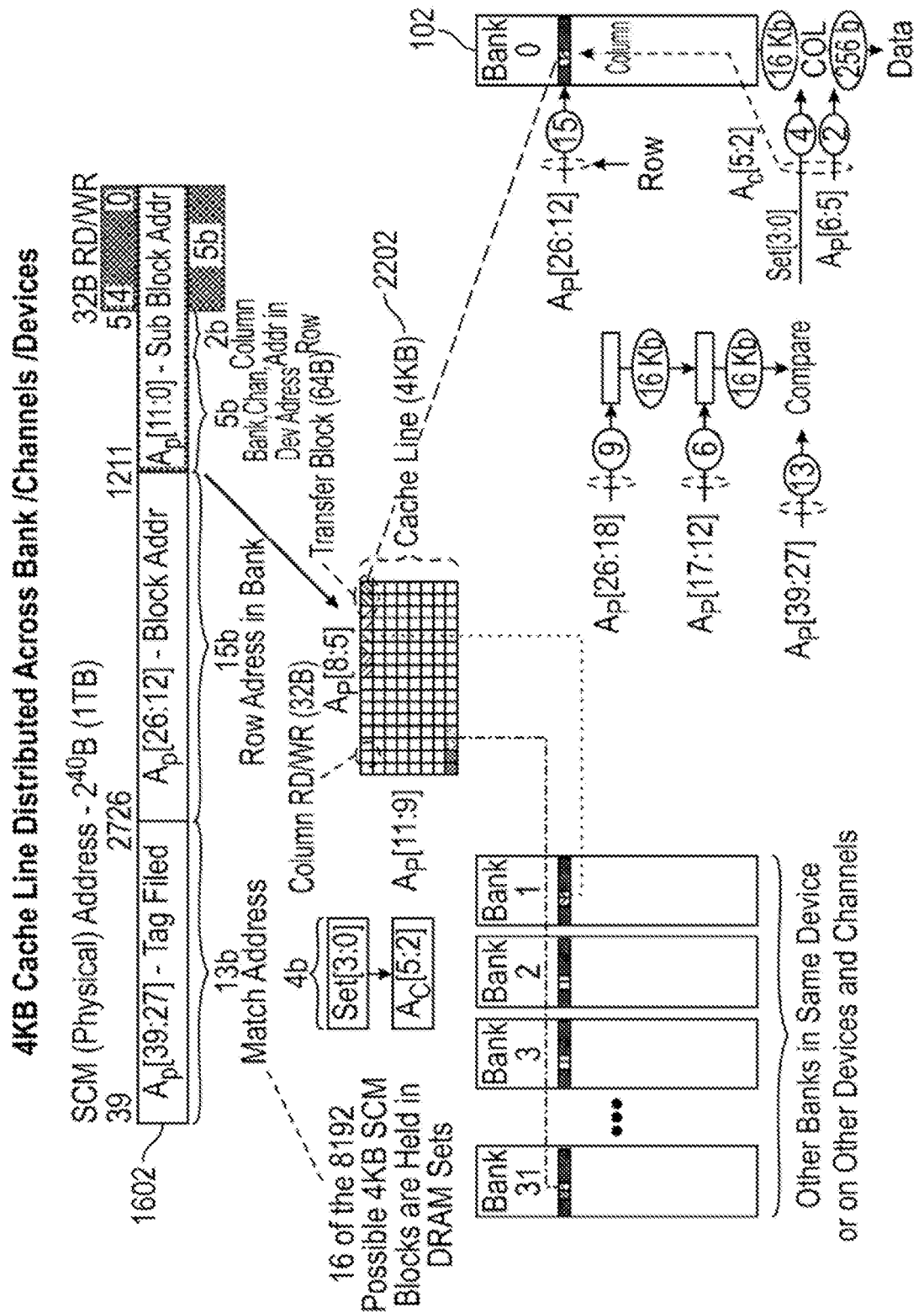
FIG. 21A depicts a 4 kB cache line distributed across banks/channels/devices in accordance with present embodiments.

FIG. 21A depicts a 4 kB cache line distributed across banks/channels/devices in accordance with present embodiments. In this example, the data and associated tag for each 4 kB cache line are distributed across all the available banks 102 (e.g., 32 banks from two DRAMs and two channels per DRAM, with eight banks 102 per channel). This allows a 4 kB cache line 2202 to be transferred between the DRAMs and the controller as quickly as possible. This makes the fetch and evict processes easier to schedule. FIG. 22A shows how a 4 kB cache line 2202 in physical SCM address space is distributed across banks 102 of multiple channels and multiple devices to minimize transport time during the fetch and evict processes.

Figure 21B:
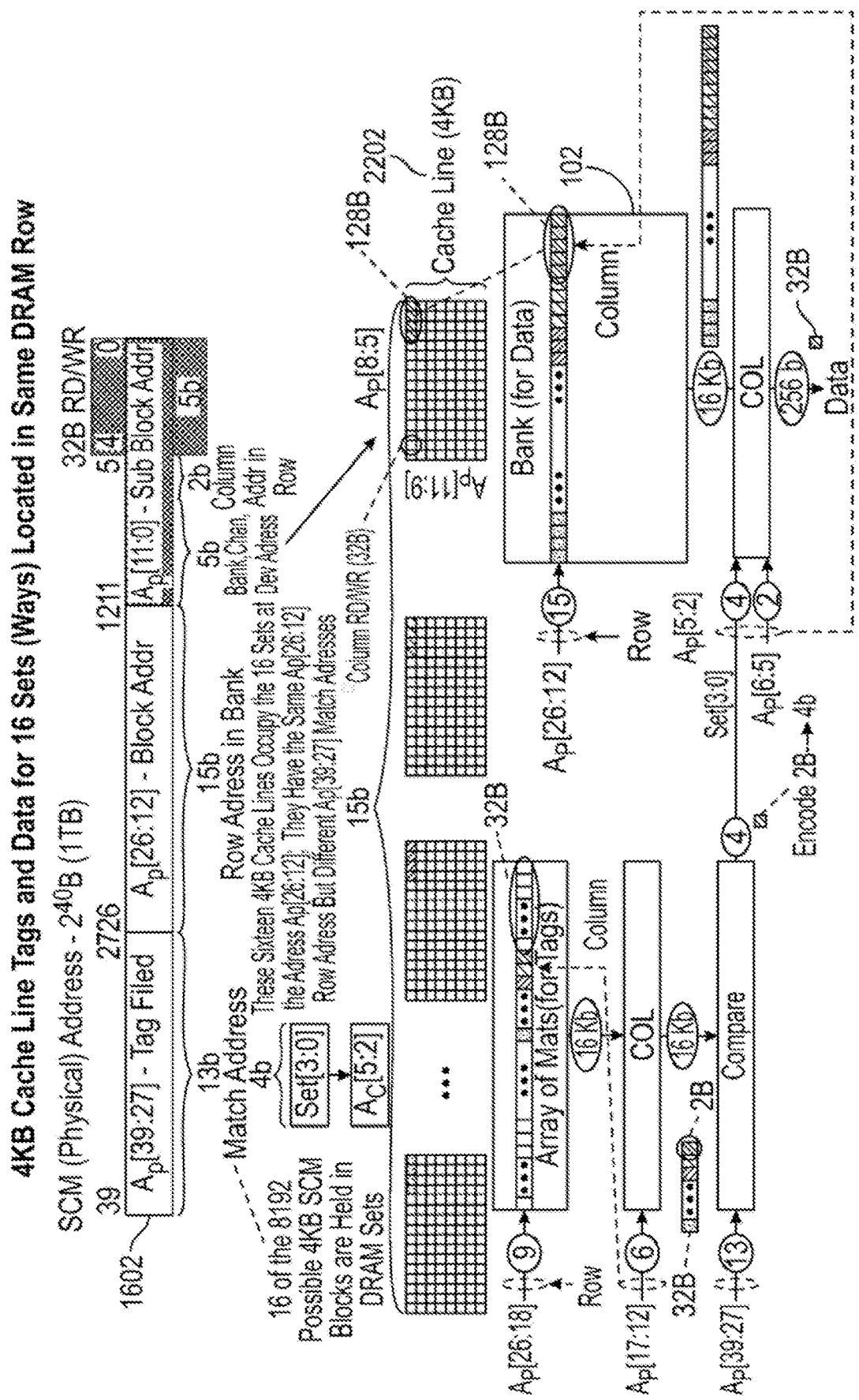
FIG. 21B depicts 4 kB cache line tags and data for 16 sets (ways) located in the same DRAM row in accordance with present embodiments.

FIG. 21B depicts 4 kB cache line tags and data for 16 sets (ways) located in the same DRAM row in accordance with present embodiments. In this example, the transfer blocks of data (e.g., two 64 byte transfer blocks) for a way are located in the same row. A way is the multiple sets of data with the same lower and middle address, but different upper address. The tags for a way are located in a single column (e.g. 16×16 bits). This generates a tag after a row/column access and tag compare, and the data after two more column accesses. The row access of the tag is overlapped with the row access of the data. FIG. 21B shows how the 16 aliased 4 kB cache lines in physical SCM address space are accessed to find the one with the matching 39:27 address. In the example, these 16 4 kB cache lines 2202 occupy the 16 sets at the address $A_P[26:12]$. The have the same $A_P[26:12]$ row address but different $A_P[39:27]$ match addresses. Note that each row of the tag match contains 64 columns of 16×16 bit tags, associated with 64 rows in the data bank 102.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of DRAMs and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, hard drives, solid-state drives (SSD), and so on.

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various equivalent modifications are possible within the scope of the disclosure, as those skilled in the relevant art will recognize. Other embodiments may have layers in different orders, additional layers or fewer layers than the illustrated embodiments.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer deposited above or over or under another layer may be directly in contact with the other layer or may have one or more intervening layers. Moreover, one layer deposited between two layers may be directly in contact with the two layers or may have one or more intervening layers. In contrast, a first layer "on" a second layer is in direct contact with that second layer. Similarly, unless explicitly stated otherwise, one feature deposited between two features may be in direct contact with the adjacent features or may have one or more intervening layers.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

What is claimed is:

1. A memory controller comprising:
    cache read logic to send a cache read command across a first memory bus to a first memory component, the cache read command including: a command opcode, a row address for a row which stores a tag field associated with data, and a tag compare field;
    cache results logic to receive a response from the first memory component across the first memory bus with the data or an indication of a miss resulting from comparing the tag compare field with the tag field stored in the row of the first memory component; and
    cache fetch logic to send a cache fetch command across a second memory bus to a second memory component, in response to the indication of the miss, the cache fetch command to cause the second memory component to send the data associated with the tag field stored in the row of the first memory component to the memory controller.

2. The memory controller of claim 1, wherein the cache fetch logic is to write the data received from the second memory component in response to the cache fetch command, into the first memory component.

3. The memory controller of claim 1, wherein the cache read logic is to retry the cache read command to the first memory component.

4. The memory controller of claim 1 wherein:
    the first memory component comprises a dynamic random access memory (DRAM) that is configurable as a cache memory and has the row which stores the tag field; and
    the second memory component comprises storage class memory (SCM).

5. The memory controller of claim 1, wherein the cache read command comprises:
    a first command comprising a first tag field and a row address field;
    a second command comprising a second tag field and a column address field; and
    a third command comprising a redundant tag field.

6. The memory controller of claim 1, wherein the cache read command comprises:
    a first command comprising a row address field;
    a second command comprising two tag fields; and
    a third command comprising a redundant tag field.

7. The memory controller of claim 1, wherein the cache read command comprises:
    a first command comprising a row address field;
    a second command comprising a first tag field and a column address field; and
    a third command comprising a second tag field.

* * * * *